United States Patent
Tabata et al.

(10) Patent No.: US 12,334,934 B2
(45) Date of Patent: Jun. 17, 2025

(54) DELAY ADJUSTMENT CIRCUIT AND DISTANCE MEASURING DEVICE

(71) Applicant: SONY SEMICONDUCTOR SOLUTIONS CORPORATION, Kanagawa (JP)

(72) Inventors: Mitsushi Tabata, Kanagawa (JP); Takashi Masuda, Kanagawa (JP); Daisuke Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 3 days.

(21) Appl. No.: 18/549,067

(22) PCT Filed: Mar. 2, 2022

(86) PCT No.: PCT/JP2022/008896
§ 371 (c)(1),
(2) Date: Sep. 5, 2023

(87) PCT Pub. No.: WO2022/190997
PCT Pub. Date: Sep. 15, 2022

(65) Prior Publication Data
US 2024/0072781 A1    Feb. 29, 2024

(30) Foreign Application Priority Data
Mar. 12, 2021 (JP) .................................. 2021-040385

(51) Int. Cl.
*H03K 5/133* (2014.01)
*G01S 7/4915* (2020.01)
(Continued)

(52) U.S. Cl.
CPC ............ *H03K 5/133* (2013.01); *G01S 7/4915* (2013.01); *H03K 5/1565* (2013.01); *H03K 2005/00071* (2013.01)

(58) Field of Classification Search
None
See application file for complete search history.

(56) References Cited

U.S. PATENT DOCUMENTS 5,550,499 A * 8/1996 Eitrheim .............. H03K 5/1565
327/175

FOREIGN PATENT DOCUMENTS

| JP | 04-070135 A | 3/1992 |
| JP | 08-021743 A | 1/1996 |

(Continued)

OTHER PUBLICATIONS

International Search Report and Written Opinion of PCT Application No. PCT/JP2022/008896, issued on May 31, 2022, 12 pages of ISRWO.

(Continued)

*Primary Examiner* — Cassandra F Cox
(74) *Attorney, Agent, or Firm* — CHIP LAW GROUP

(57) ABSTRACT

A delay adjustment circuit according to an embodiment includes: a plurality of delay adjustment units connected in series, each of the plurality of delay adjustment units including one or more first delay elements (102) connected in series that delay an input signal on the basis of a clock, and a first selector (120) that outputs one of the input signal and an output of the first delay element at a last stage among the one or more first delay elements; and an output unit (103, 104, 130a, 130b, 140) that outputs a clock according to an output of the first selector included in a delay adjustment unit at a last stage among the plurality of delay adjustment (Continued)

units, in which each of the plurality of delay adjustment units includes a different number of the first delay elements.

10 Claims, 15 Drawing Sheets

(51) Int. Cl.
 *H03K 5/156* (2006.01)
 *H03K 5/00* (2006.01)

(56) References Cited

FOREIGN PATENT DOCUMENTS

| | | |
|---|---|---|
| JP | 11-234099 A | 8/1999 |
| JP | 2000-122750 A | 4/2000 |
| JP | 2001-005554 A | 1/2001 |
| JP | 2006-295719 A | 10/2006 |
| JP | 2008-219535 A | 9/2008 |
| WO | 2005/069487 A1 | 7/2005 |
| WO | 2020/100673 A1 | 5/2020 |

OTHER PUBLICATIONS

Nippon Precision Circuits Inc. Nippon Precision Circuits Inc, Catalog for SM5829P, Aug. 1991, pp. 1-8.

\* cited by examiner

DELAY ADJUSTMENT CIRCUIT AND DISTANCE MEASURING DEVICE

CROSS REFERENCE TO RELATED APPLICATIONS

This application is a U.S. National Phase of International Patent Application No. PCT/JP2022/008896 filed on Mar. 2, 2022, which claims priority benefit of Japanese Patent Application No. JP 2021-040385 filed in the Japan Patent Office on Mar. 12, 2021. Each of the above-referenced applications is hereby incorporated herein by reference in its entirety.

FIELD

The present disclosure relates to a delay adjustment circuit and a distance measuring device.

BACKGROUND

It may be necessary to adjust the timing of a clock signal with high accuracy. For example, in time of flight (ToF), which is one of distance measuring methods, reflected light emitted at a light source and reflected at an object to be measured is received by a light receiving unit, and distance measurement is performed on the basis of a light emission timing at the light source and a timing at which the light is received by the light receiving unit. In the ToF method, since the distance measurement is performed using the speed of light, more accurate clock control is required.

Patent Literature 1 describes a configuration in which clocks whose timings are shifted little by little are input to a plurality of FF (flip-flop) circuits arranged in parallel, and an output of each of the plurality of FF circuits is selected by a selector. According to the configuration of Patent Literature 1, it is possible to control the timing of the clock in a finer unit.

CITATION LIST

Patent Literature

Patent Literature 1: JP 2008-219535 A

SUMMARY

Technical Problem

According to the configuration of Patent Literature 1, since the plurality of FF circuits is connected to a plurality of selection input terminals of the selector, respectively, all the connected FF circuits appear as loads from the selector. As described above, in the configuration of Patent Literature 1, since the output load of the selector is large, it is difficult to operate at a high speed.

An object of the present disclosure is to provide a delay adjustment circuit and a distance measuring device capable of adjusting a timing of a clock as desired and performing a high-speed operation.

Solution to Problem

For solving the problem described above, a delay adjustment circuit according to one aspect of the present disclosure has a plurality of delay adjustment units connected in series, each of the delay adjustment units including one or more first delay elements connected in series that delay an input signal based on a clock, and a first selector that outputs one of the input signal and an output of the first delay element at a last stage among the one or more first delay elements; and an output unit that outputs the clock according to an output of the first selector included in a delay adjustment unit of a last stage among the plurality of delay adjustment units, wherein each of the plurality of delay adjustment units includes a different number of the first delay elements.

DESCRIPTION OF EMBODIMENTS

Figure 1:
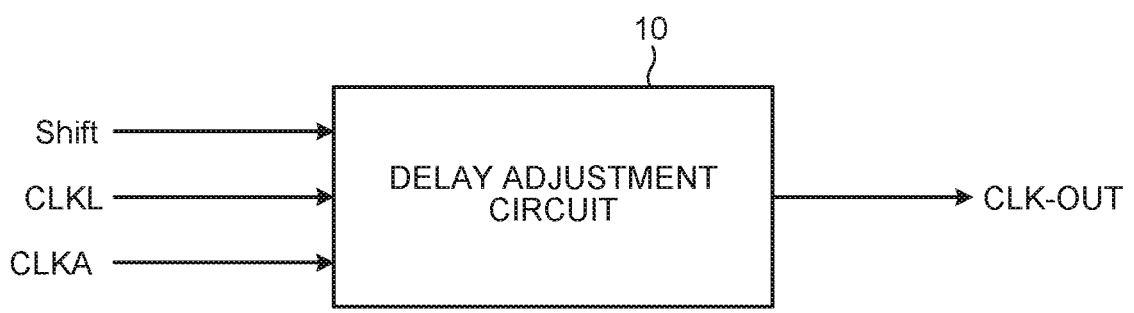
FIG. 1 is a schematic diagram schematically illustrating a delay adjustment circuit according to the present disclosure.

Hereinafter, embodiments of the present disclosure will be described in detail with reference to the drawings. Note that, in the following embodiments, the same parts are denoted by the same reference signs, and redundant description will be omitted.

Hereinafter, the embodiments of the present disclosure will be described in the following order.

1. Schematic description of present disclosure
2. First embodiment of present disclosure
2-1. Delay adjustment circuit according to first embodiment
2-2. Comparison with existing technology
2-3. Another example of delay adjustment circuit according to first embodiment
3. First modification example of first embodiment
4. Second modification example of first embodiment
5. Third modification example of first embodiment
6. Fourth modification example of first embodiment
7. Second embodiment of present disclosure
8. Third embodiment of present disclosure
8-1. Schematic description of indirect ToF
8-2. Configuration example for implementing indirect ToF

1. Schematic Description of Present Disclosure

FIG. 1 is a schematic diagram schematically illustrating a delay adjustment circuit according to the present disclosure. In FIG. 1, clocks CLKL and CLKA and a signal Shift are input to a delay adjustment circuit 10 according to the present disclosure. For example, the clock CLKL and the signal Shift are input from an external logic circuit to the delay adjustment circuit 10. The signal Shift is, for example, a trigger signal, and controls an external device or the like according to the signal Shift. The clock CLKL is a clock supplied from the logic circuit. The clock CLKA is a clock having a very short period with respect to the clock CLKL.

After the clock CLKL and the signal Shift are input from the logic circuit at the rising of the clock CLKL, the delay adjustment circuit 10 outputs an output signal CLK-OUT, which is a clock of the same cycle as the clock CLKA, according to the rising of the next clock CLKL. At this time, the delay adjustment circuit 10 can output the output signal CLK-OUT by adjusting the phase in units of one cycle, ½ cycle, or the like of the clock CLKA.

For example, by supplying the output signal CLK-OUT to the external device, the external device can be controlled at a timing when the rising of the signal Shift is delayed as desired in units of the clock CLKA.

Here, the delay adjustment circuit 10 according to the present disclosure forms groups in which different numbers of delay elements for delaying the signal Shift are put together. The groups are connected in series in the delay adjustment circuit 10. The delay adjustment circuit 10 includes, for each of these groups, a selector that selects a signal Shift output via a delay element in the group and a signal Shift output by canceling the delay element, and configures a delay adjustment unit for each group.

With such a configuration, a load on the output can be reduced, and a high-speed operation can be performed. Therefore, an operation of the external device can be controlled with higher accuracy.

2. First Embodiment of Present Disclosure

Next, a first embodiment of the present disclosure will be described.

2-1. Delay Adjustment Circuit According to First Embodiment

Figure 2:
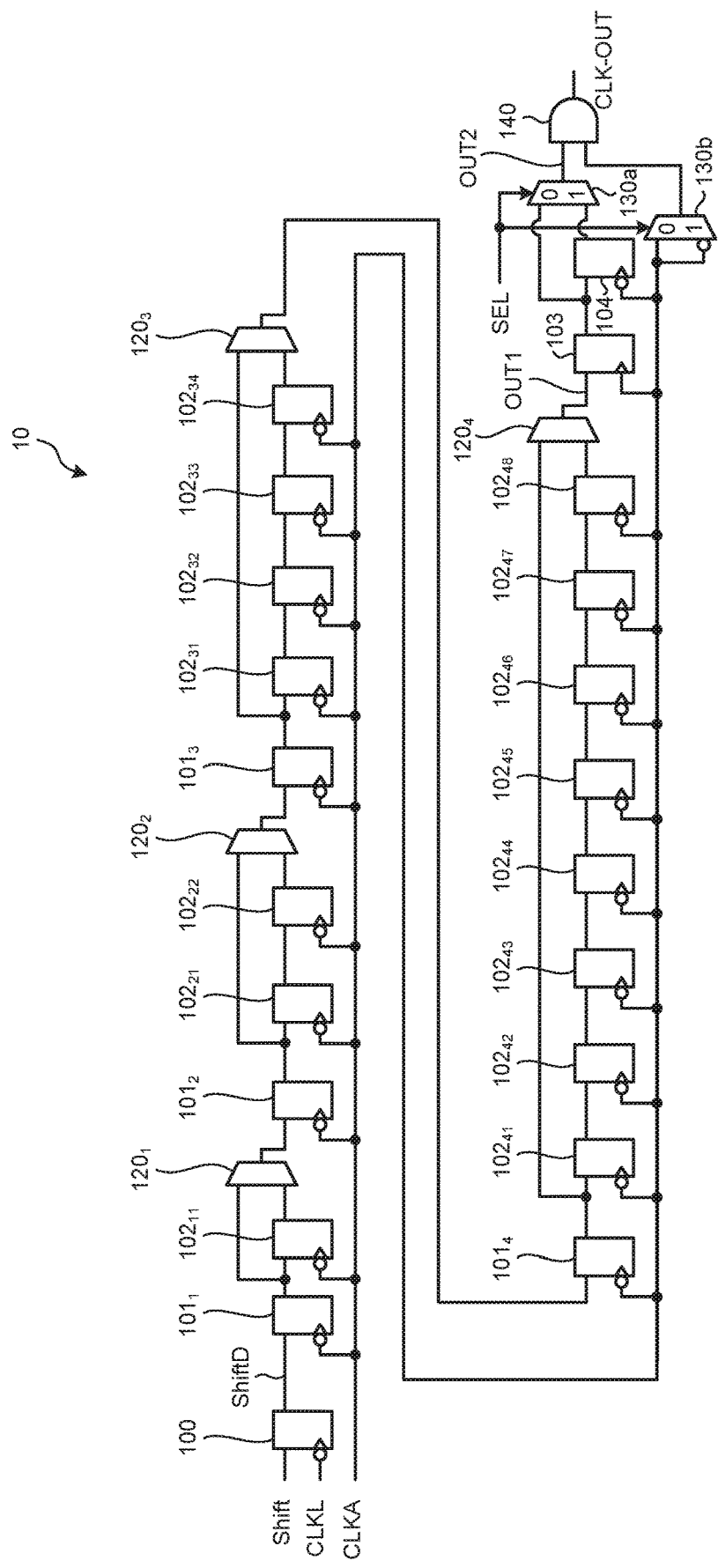
FIG. 2 is a circuit diagram illustrating a configuration of an example of a delay adjustment circuit according to a first embodiment of the present disclosure.

FIG. 2 is a circuit diagram illustrating a configuration of an example of a delay adjustment circuit 10 according to a first embodiment of the present disclosure. In FIG. 2, the delay adjustment circuit 10 includes FF (flip-flop) circuits 100, $101_1$ to $101_4$, $102_{11}$ to $102_{48}$, 103, and 104, selectors $120_1$ to $120_4$, selectors 130a and 130b, and an AND circuit 140.

In each of the selectors $120_1$ to $120_4$, for example, one input terminal and the other input terminal are switched according to a control signal from the outside. Similarly, in the selectors 130a and 130b, one input terminal and the other input terminal are switched according to a signal SEL from the outside. Each of the selectors $120_1$ to $120_4$ can independently switch between one input terminal and the other input terminal.

The clock CLKA is inverted and input to a clock input terminal of each of the FF (flip-flop) circuits 100, $101_1$ to $101_4$, $102_{11}$ to $102_{48}$, and 104, which are D-flip-flop circuits. Furthermore, the non-inverted clock CLKA is input to the clock input terminal of the FF circuit 103. That is, each of the FF (flip-flop) circuits 100, $101_1$ to $101_4$, $102_{11}$ to $102_{48}$, 103, and 104 is used as a delay element that delays the input signal by a delay time of one clock (one cycle) of the clock CLKA.

To the FF circuit 100, the signal Shift is input to a data input terminal, and the clock CLKL is inverted and input to a clock input terminal. The FF circuit 100 outputs the signal Shift as a signal ShiftD at the falling timing of the clock CLKL.

The signal ShiftD is input to a data input terminal of the FF circuit $101_1$. The FF circuit $101_1$ delays the signal ShiftD by one clock of the clock CLKA and outputs the delayed signal ShiftD. An output of the FF circuit $101_1$ is input to a data input terminal of the FF circuit $102_{11}$ and one input terminal of the selector $120_1$. An output of the FF circuit $102_{11}$ is input to the other input terminal of the selector $120_1$. An output of the selector $120_1$ is input to a data input terminal of the FF circuit $101_2$.

That is, in a case where the other input terminal is selected, the selector $120_1$ outputs, to the next stage, a signal obtained by delaying the output from the FF circuit $101_1$ by one clock of the clock CLKA by the FF circuit $102_{11}$. Furthermore, in a case where one input terminal is selected, the selector $120_1$ can cancel the FF circuit $102_{11}$ and output the signal to the next stage without delay.

Note that, in practice, the output of the selector $120_1$ includes a delay by the selector $120_1$ itself. Hereinafter, a delay caused by each of the selector $120_1$ (and the selectors $120_2$ to $120_4$ to be described later) itself is ignored unless otherwise specified.

The output of the selector $120_1$ is delayed by one clock of the clock CLKA by the FF circuit $101_2$. An output of the FF circuit $101_2$ is input to a data input terminal of the leading FF circuit $102_{21}$ of the two FF circuits $102_{21}$ and $102_{22}$ connected in series and one input terminal of the selector $120_2$. The output of the FF circuit $101_2$ is delayed by two clocks of the clock CLKA by the two FF circuits $102_{21}$ and $102_{22}$ connected in series, and is input to the other input terminal of the selector $120_2$.

That is, in a case where the other input terminal is selected, the selector $120_2$ outputs a signal obtained by delaying the output from the FF circuit $101_2$ by two clocks of the clock CLKA to the next stage. Furthermore, in a case where one input terminal is selected, the selector $120_2$ cancels the FF circuits $102_{21}$ and $102_{22}$ and outputs the signal to the next stage without delay.

The output of the selector $120_2$ is delayed by one clock of the clock CLKA by the FF circuit $101_3$. The output of the FF circuit $101_3$ is input to a data input terminal of the leading FF circuit $102_{31}$ of the four FF circuits $102_{31}$ to $102_{34}$ connected in series and one input terminal of the selector $120_3$. The output of the FF circuit $101_2$ is delayed by four clocks of the clock CLKA by four FF circuits $102_{31}$ to $102_{33}$ connected in series, and is input to the other input terminal of the selector $120_3$.

That is, in a case where the other input terminal is selected, the selector $120_3$ outputs a signal obtained by delaying the output from the FF circuit $101_3$ by 4 clocks of the clock CLKA to the next stage. Furthermore, in a case where one input terminal is selected, the selector $120_3$ cancels the FF circuit $102_{31}$ to $102_{33}$ and outputs the signal to the next stage without delay.

The output of the selector $120_3$ is delayed by one clock of the clock CLKA by the FF circuit $101_4$. The output of the FF circuit $101_4$ is input to a data input terminal of the leading FF circuit $102_{41}$ of the eight FF circuits $102_{41}$ to $102_{48}$ connected in series and one input terminal of the selector $120_4$. The output of the FF circuit $101_4$ is delayed by 8 clocks of the clock CLKA by 8 FF circuits $102_{41}$ to $102_{48}$ connected in series, and is input to the other input terminal of the selector $120_4$.

That is, in a case where the other input terminal is selected, the selector $120_4$ outputs a signal obtained by delaying the output from the FF circuit $101_4$ by 8 clocks of the clock CLKA to the next stage. Furthermore, in a case where one input terminal is selected, the selector $120_4$ cancels the FF circuits $102_{41}$ to $102_{48}$ and outputs the signal to the next stage without delay.

As described above, each of the combination of the FF circuit $102_{11}$ and the selector $120_1$, the combination of the two FF circuits $102_{21}$ and $102_{22}$ and the selector $120_2$, the combination of the four FF circuits $102_{31}$ to $102_{34}$ and the selector $120_3$, and the combination of the eight FF circuits $102_{41}$ to $102_{48}$ and the selector $120_4$ can select whether or not to provide a delay by one or more FF circuits connected in series to the input signal. In this manner, each of these combinations functions as a delay adjustment unit that adjusts the delay amount with respect to the input signal.

Furthermore, by connecting a plurality of the delay adjustment units having different delay amounts (the number of FF circuits included) in series, it is possible to cope with adjustment of more various delay amounts. In the example of FIG. 2, the four delay adjustment units each include one FF circuit $102_{11}$, two FF circuits $102_{21}$ and $102_{22}$, four FF circuits $102_{31}$ to $102_{34}$, and eight FF circuits $102_{41}$ to $102_{48}$. That is, the four delay adjustment units include a power-of-two number of FF circuits different from each other.

Therefore, by appropriately setting each of the selectors $120_1$ to $120_4$ of the delay adjustment units, it is possible to obtain a delay of 0 to 15 clocks of the clock CLKA at the output of the selector $120_4$.

For example, by selecting the other input terminal (input terminal on a side of the FF circuit $102_{11}$) in the selector $120_1$ and selecting one input terminal in each of the other selectors $120_2$ to $120_4$, a delay of one clock of the clock CLKA can be obtained. Furthermore, for example, by selecting the other input terminal in each of the selectors $120_1$ and $120_3$ and selecting one input terminal in each of the selectors $120_2$ and $120_4$, a delay of 5 clocks of the clock CLKA can be obtained.

The output of the selector $120_4$ is input as a signal OUT1 to a data input terminal of the FF circuit 103 to which the clock CLKA is input in a non-inverted manner. An output of the FF circuit 103 is input to a data input terminal of the FF circuit 104 and an input terminal [0] of the selector 130a. An output of the FF circuit 104 is input to an input terminal [1] of the selector 130a.

Either the input terminal [0] or the input terminal [1] of the selector 130a is selected in accordance with the signal SEL. For example, in the selector 130a, the input terminal [0] is selected when the signal SEL is in a low state, and the input terminal [1] is selected when the signal SEL is in a high state. In a case where the input terminal [0] is selected, the selector 130a outputs the output of the FF circuit 103 as it is as a signal OUT2.

On the other hand, in a case where the input terminal [1] is selected, the selector 130a outputs the output of the FF circuit 104 as the signal OUT2. Since the inverted clock CLKA is input to the clock input terminal, the FF circuit 104 delays the signal OUT1 output from the FF circuit 103 operating with the non-inverted clock CLKA by a half cycle of the clock CLKA, and outputs the delayed signal OUT1. Therefore, the signal OUT2 is a signal obtained by delaying the signal OUT1 by a half cycle of the clock CLKA.

In this manner, the selector 130a adjusts the delay amount of the signal OUT2 by the half cycle of the clock CLKA in accordance with the signal SEL.

The output of the selector 130a is input to one input terminal of the AND circuit 140. The output of the selector 130b is input to the other input terminal of the AND circuit 140. In the selector 130b, the clock CLKA is input to the input terminal [0], and the clock CLKA is inverted and input to the input terminal [1]. As with the selector 130a described above, either the input terminal [0] or [1] of the selector 130b is selected in accordance with the signal SEL.

In a case where the output of the selector 130a is in a high state, that is, the value [1], the AND circuit 140 enables the output of the selector 130b at the output thereof. At this time, in the selector 130b, the input terminal [0] is selected together with the selection of the input terminal [0] in the selector 130a, and the clock CLKA is input to the other input terminal of the AND circuit 140 as it is. On the other hand, in the selector 130b, the input terminal [1] is selected together with the selection of the input terminal [1] in the selector 130a, and the inverted clock CLKA, that is, the clock CLKA delayed by the half cycle is input to the other input terminal of the AND circuit 140.

The clock CLKA enabled at the output of the AND circuit 140 is output from the delay adjustment circuit 10 as an output signal CLK-OUT. The output signal CLK-OUT is a signal enabled at a timing when the signal Shift input to the FF circuit 100 is delayed by a predetermined delay amount in the delay adjustment circuit 10.

Here, in the configuration of FIG. 2, the signal ShiftD passes through the FF circuits $101_1$, $101_2$, $101_3$, and $101_4$ regardless of the state of each of the selectors $120_1$ to $120_4$. Therefore, the FF circuits $101_1$ to $101_4$ impart a fixed delay to the signal ShiftD. Therefore, the FF circuits $101_1$ to $101_4$ have a function as a buffer that gives a fixed waiting time to the input signal Shift.

In the example of FIG. 2, the FF circuits $101_1$ to $101_4$ are disposed one by one immediately before each of the delay adjustment units. This is not limited to this example, and the FF circuits $101_1$ to $101_4$ can be disposed in a number according to a required waiting time.

Figure 3A:
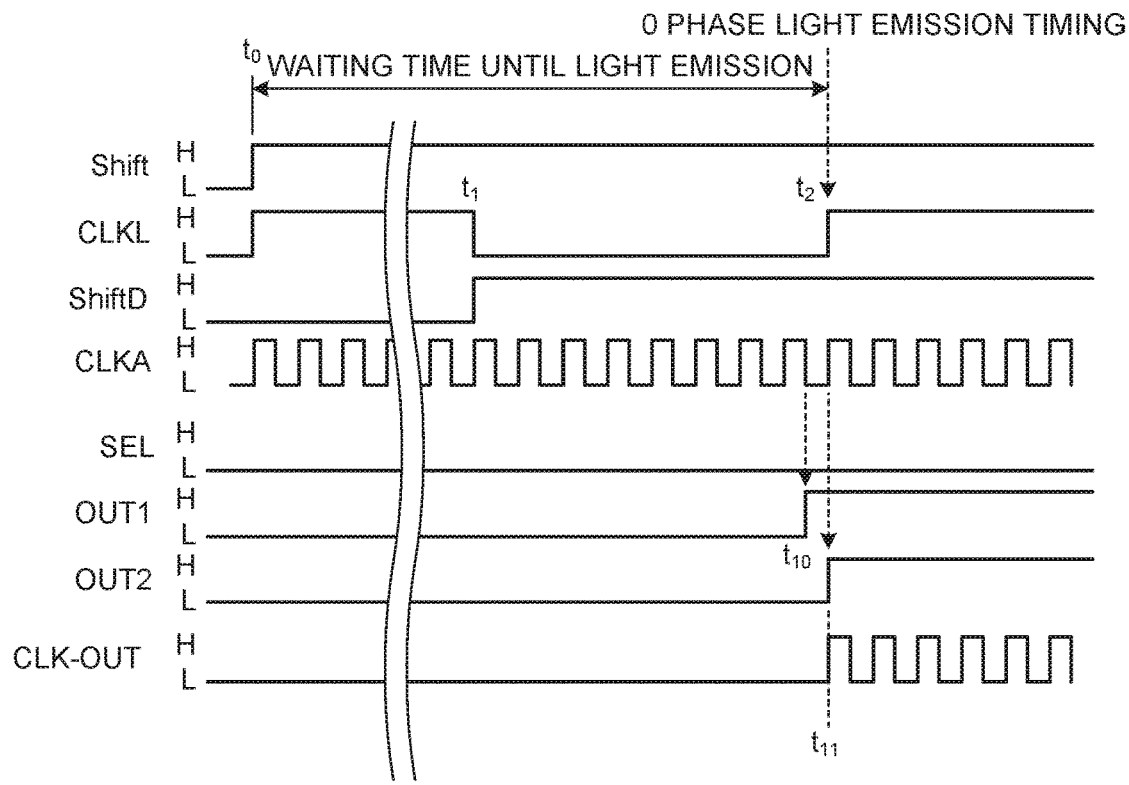
FIG. 3A is a timing chart illustrating an operation of an example of the delay adjustment circuit according to the first embodiment.
Figure 3B:
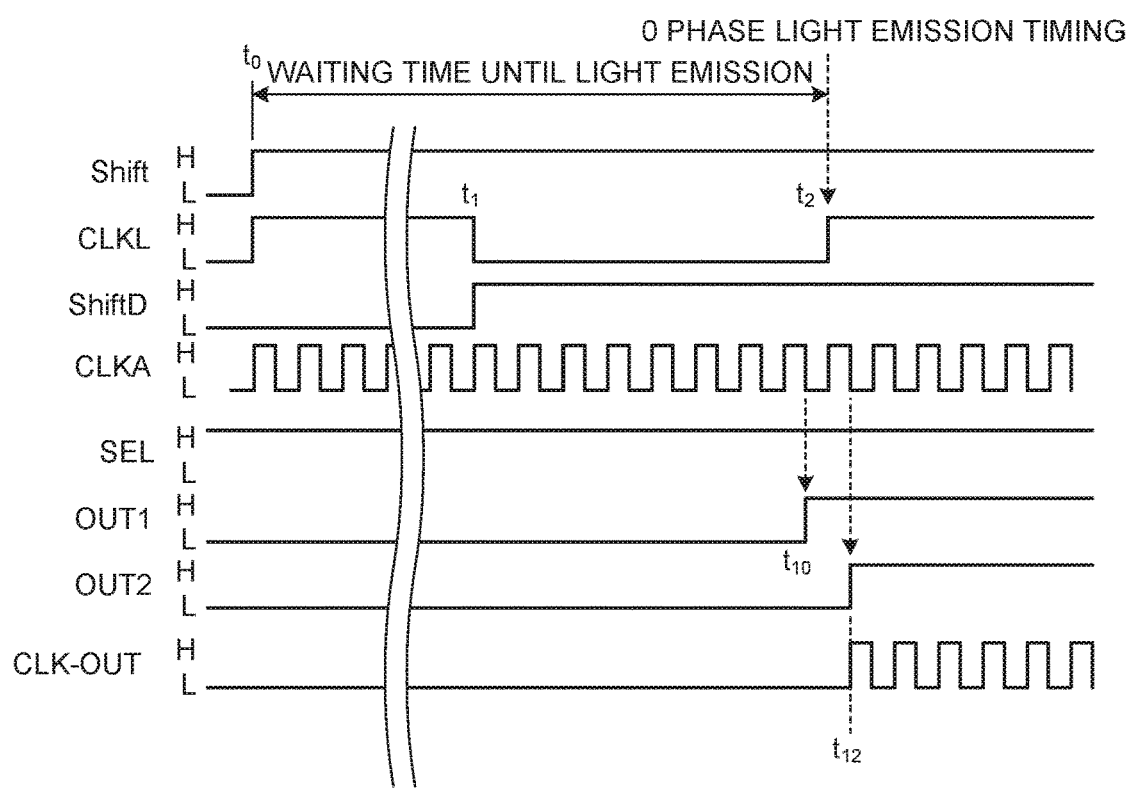
FIG. 3B is a timing chart illustrating an operation of an example of the delay adjustment circuit according to the first embodiment.

Next, an operation of the delay adjustment circuit 10 according to the first embodiment will be described. FIGS. 3A and 3B are timing charts illustrating an operation of an example of the delay adjustment circuit 10 according to the first embodiment. In each of FIGS. 3A and 3B, the signal Shift, the clock CLKL, the signal ShiftD, the clock CLKA, the signal SEL, the signal OUT1, the signal OUT2, and the output signal CLK-OUT are illustrated from the top. Note that, in the examples of FIGS. 3A and 3B, the clock CLKL is a cycle having a length of an integral multiple of the clock CLKA.

Note that, here, a case where the delay adjustment circuit 10 is applied to the control of a light emission timing of a light source in an indirect ToF that performs distance measurement on the basis of a phase difference between the light emitted by the light source and the light received by a light receiving unit among time of flight (ToF) that is one of the distance measurement methods will be described as an example. For example, a logic circuit that controls the distance measurement by ToF instructs the light source to emit light by rising of the signal Shift. The light source is driven after a predetermined waiting time from the light emission instruction by the signal Shift and emits light. By making this waiting time known, the logic circuit can execute the distance measurement using reflected light of light emitted by the light source. Details of an application example of the present disclosure to the indirect ToF will be described later.

Here, the delay adjustment circuit 10 outputs the output signal CLK-OUT at a desired timing after the logic circuit outputs the signal Shift. The light source is driven and emits light in accordance with the output signal CLK-OUT. For example, a case is considered in which the delay adjustment circuit 10 outputs the output signal CLK-OUT at the rise of the next clock CLKL after the logic circuit outputs the signal Shift with the rise of the clock CLKL. In this case, the input terminal [0] is selected in the selector 130 by the signal SEL.

The timing chart illustrated in FIG. 3A illustrates an example in a case where the signal SEL is in the L (low) state and the input terminal [0] is selected in each of the selectors 130a and 130b. In FIG. 3A, the signal Shift is input (the signal Shift rises) as the clock CLKL rises at time $t_0$. It is assumed that the light emission timing of 0 phase (phase is 0°) is given to the light source with a waiting time from the input of the signal Shift to the next rise time $t_2$ of the clock CLKL.

The signal Shift is taken in by the FF circuit 100 and is output from the FF circuit 100 as the signal ShiftD according to the falling of the clock CLKL (time $t_1$). The signal ShiftD is delayed by the delay of four clocks of the clock CLKA by the FF circuits $101_1$ to $101_4$ and the four delay adjustment units, that is, the FF circuit $102_{11}$ and the selector $120_1$, the FF circuits $102_{21}$ and $102_{22}$ and the selector $120_2$, the FF circuits $102_{31}$ to $102_{34}$ and the selector $120_3$, and the FF circuits $102_{41}$ to $102_{48}$ and the selector $120_4$, and is output from the selector $120_4$ as the signal OUT1 (time $t_{10}$).

As illustrated in FIG. 3A, the signal OUT1 is a signal that rises at time $t_{10}$ that is a half cycle before the clock CLKA with respect to time $t_2$. The signal OUT1 is delayed by a half cycle of the clock CLKA by the FF circuit 103 operated by the non-inverted clock CLKA, and is input to the input terminal [0] of the selector 130 and the FF circuit 104. The input terminal [0] of the selector 130a is selected by the signal SEL. Therefore, the signal OUT2 output from the selector 130 is a signal that rises at time $t_{11}$, which is obtained by delaying the signal OUT1 by a half cycle of the clock CLKA. The signal OUT2 is input to one input terminal of the AND circuit 140.

On the other hand, the input terminal [0] of the selector 130b is selected according to the signal SEL, and the clock CLKA is output as it is. In the AND circuit 140, the clock CLKA output from the selector 130b and input to the other input terminal is enabled from time $t_{11}$ by the signal OUT2 input to one input terminal, and is output as the output signal CLK-OUT. In response to the output signal CLK-OUT, for example, the light source is driven so as to emit light in the 0 phase. In the example of FIG. 3A, the time $t_{11}$ of the output timing of the output signal CLK-OUT coincides with the time $t_2$ which is the light emission timing at the 0 phase (phase 0°) instructed by the logic circuit.

The timing chart illustrated in FIG. 3B illustrates an example in a case where the signal SEL is in the H (high) state and the input terminal [1] is selected in each of the selectors 130a and 130b. In the case of this example, the signal ShiftD is delayed by four delay adjustment units, and the signal OUT1 output from the selector $120_4$ at time $t_{10}$ is delayed by a half cycle of the clock CLKA through the FF circuit 103 operating with the non-inverted clock CLKA and the FF circuit 104 operating with the inverted clock CLKA. The signal OUT1 delayed by a half cycle of the clock CLKA is input to the input terminal [1] of the selector 130 and output from the selector 130 as the signal OUT2.

On the other hand, the input terminal [1] of the selector 130b is selected according to the signal SEL, and the clock CLKA is inverted and output. In the AND circuit 140, the inverted and input clock CLKA is validated by the signal OUT2 output from the selector 130, and is output as the output signal CLK-OUT. In this example, the time $t_{12}$ of the output timing of the output signal CLK-OUT is delayed by a half cycle of the clock CLKA with respect to the time $t_2$ which is the light emission timing at the 0 phase instructed by the logic circuit.

As described above, the delay adjustment circuit 10 according to the first embodiment can enable the output signal CLK-OUT at a desired timing based on the clock CLKA in accordance with the input signal Shift. At this time, the delay adjustment circuit 10 according to the first embodiment gives a fixed delay amount corresponding to several cycles of the clock CLKA to the signal Shift by the FF circuits $101_1$ to $101_4$, and further gives a delay corresponding to a half cycle of the clock CLKA by the signal SEL. Therefore, the delay adjustment circuit 10 can control the output timing of the output signal CLK-OUT according to the input signal Shift with higher accuracy.

Note that, in FIG. 2, the inverted clock CLKA is input to the clock input terminals of the FF circuits 100, $101_1$ to $101_4$, $102_{11}$ to $102_{48}$, and 104, and the clock CLKA is input to the clock input terminal of the FF circuit 103 in a non-inverted manner, but this is not limited to this example. For example, the inversion and non-inversion of the clock CLKA input to the clock input terminal of each FF circuit may be opposite to those in the example of FIG. 2.

Furthermore, in FIG. 2, each delay adjustment unit is connected in the order of the power of 2 of the number of included FF circuits, but this is not limited to this example, and each delay adjustment unit may be connected in another order. Moreover, each of the selectors $120_2$ to $120_4$ has two input terminals, but this is not limited to this example, and may have three or more input terminals.

Furthermore, in FIG. 2, an FF circuit is used as a delay element that provides a delay corresponding to one clock of the clock CLKA, but this is not limited to this example. For example, it is conceivable to apply, as the delay element, a clock inverter having a four-stage configuration of a transistor or a transfer gate (latch circuit), which is an inverter that outputs according to a clock.

Note that, in the configuration of FIG. 2, among the FF circuits $102_{11}$ to $102_{48}$ for providing a delay according to the clock CLKA, the operation of the FF circuit whose one input terminal is selected in the selector $120_1$ to $120_4$ at the subsequent stage may be stopped. For example, in a case where one input terminal (an input terminal that cancels the FF circuits $102_{31}$ to $102_{34}$) is selected in the selector $120_3$, the operation of the FF circuits $102_{31}$ to $102_{34}$ can be stopped. With such a configuration, power consumption in the delay adjustment circuit 10 can be reduced.

2-2. Comparison with Existing Technology

Figure 4:
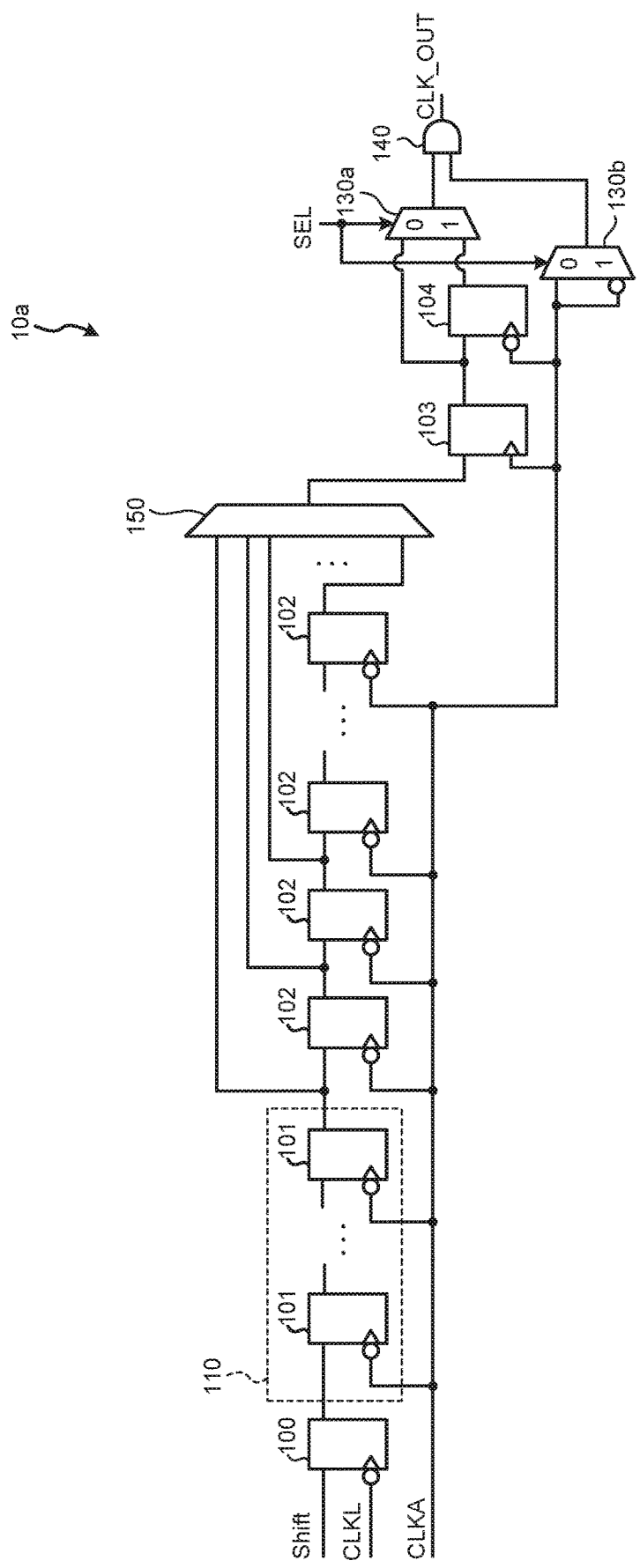
FIG. 4 is a circuit diagram illustrating a configuration of an example of a delay adjustment circuit according to an existing technology.

Here, the delay adjustment circuit 10 according to the first embodiment will be described in comparison with a delay adjustment circuit according to an existing technology. FIG. 4 is a circuit diagram illustrating a configuration of an example of a delay adjustment circuit according to an existing technology. A delay adjustment circuit 10a illustrated in FIG. 4 is an example in which the configuration described in Patent Literature 1 described above is applied to the delay adjustment circuit 10 according to the first embodiment.

In FIG. 4, the delay adjustment circuit 10a includes an FF circuit 100 to 104, selectors 130a and 130b, a selector 150, and an AND circuit 140. Furthermore, a plurality of FF circuits 101 is connected in series to constitute a buffer unit 110.

In FIG. 4, to the FF circuit 100, a signal Shift is input to a data input terminal, and a clock CLKL is inverted and input to a clock input terminal. The FF circuit 100 latches the signal Shift by the clock CLKL and outputs the signal Shift as a signal ShiftD. The signal ShiftD is input to the buffer unit 110. The buffer unit 110 delays and outputs the input signal ShiftD according to the number of clocks CLKA corresponding to the number of FF circuits 101 to be connected.

The signal output from the buffer unit 110 is input to the FF circuit 102 at the foremost stage in a plurality of the FF circuits 102 connected in series. An output of each of the FF circuits 102 is input to a data input terminal of the FF circuit 102 of the next stage. Furthermore, the selector 150 has a plurality of input terminals, and the output of the buffer unit 110 and the output of each of the FF circuits 102 are input to each of the plurality of input terminals.

In such a configuration, in the selector 150, an input terminal that provides a desired delay is selected from among the plurality of input terminals, and the signal input to the selected input terminal is output from the selector 150 as the signal OUT1. Since the operation of the delay adjustment circuit 10a with respect to the signal OUT1 is similar to the operation of the delay adjustment circuit 10 with respect to the signal OUT1 output from the selector $120_4$ described with reference to FIG. 2, the description thereof will be omitted here.

In such a configuration, the timing chart of the operation is similar to the timing charts illustrated in FIGS. 3A and 3B described above. Here, the selector 150 has a large number (for example, 3 or more) of input terminals to which signals are input, and the switches of the input terminals appear as loads when viewed from a side of the selector 150. Therefore, the waveform of the signal OUT1 is blunted, and it becomes difficult for the FF circuit 103 to capture the signal OUT1 at a desired timing. Therefore, it is difficult to operate the delay adjustment circuit 10a to which the existing technology is applied at a high speed.

On the other hand, in the delay adjustment circuit 10 according to the first embodiment, the number of input terminals included in each of the selectors $120_1$ to $120_4$ for selecting the plurality of delays is two, which is much smaller than the number of input terminals of the selector 150 in the delay adjustment circuit 10a to which the existing technology is applied. Therefore, the delay adjustment circuit 10 according to the first embodiment can reduce the load in each of the selectors $120_1$ to $120_4$, and can operate at a higher speed than the delay adjustment circuit 10a to which the existing technology is applied.

2-3. Another Example of Delay Adjustment Circuit According to First Embodiment

Next, another example of the delay adjustment circuit according to the first embodiment will be described. In another example of the delay adjustment circuit according to the first embodiment, the number of FF circuits in the delay adjustment unit described above is changed, and an output circuit of the FF circuit 103, the FF circuit 104, and the selector 130 (corresponding to the selector 130a in FIG. 2) is connected, so that it is possible to variously generate a delay corresponding to a half cycle of the clock CLKA.

Figure 5:
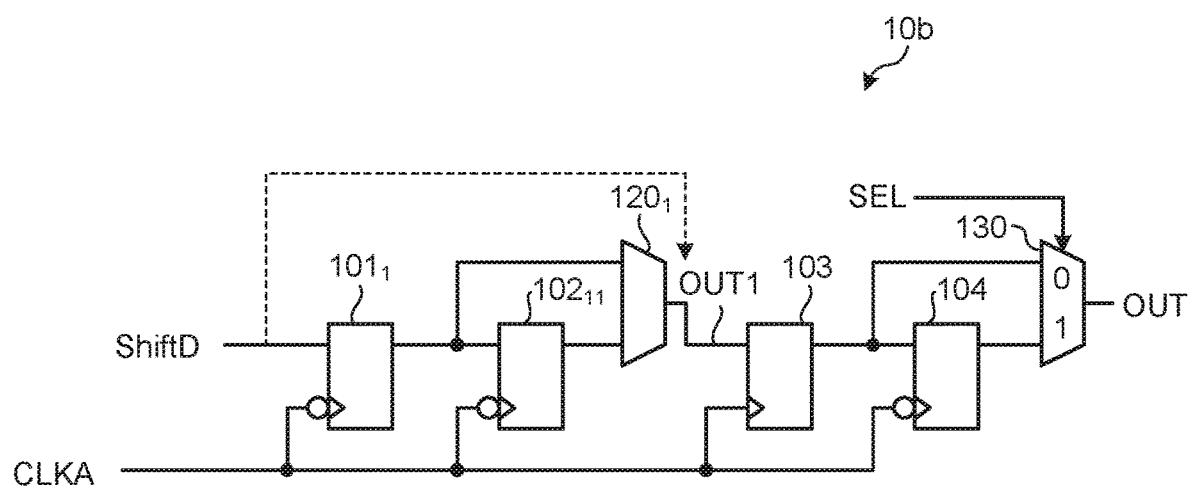
FIG. 5 is a circuit diagram illustrating a configuration of an example of a delay adjustment circuit of another example according to the first embodiment.

FIG. 5 is a circuit diagram illustrating a configuration of an example of a delay adjustment circuit of another example according to the first embodiment. Note that, in FIG. 5, the FF circuit 100 on an input side and the AND circuit 140 on an output side are omitted.

In FIG. 5, a delay adjustment circuit 10b includes one FF circuit $101_1$ for buffer and one FF circuit $102_{11}$ selected by a selector $120_1$. In this case, a signal OUT1 output from the selector $120_1$ can be selected from a signal obtained by delaying a signal ShiftD by one cycle only by the FF circuit $101_1$ and a signal obtained by delaying the signal ShiftD by two cycles by the FF circuit $101_1$ and the FF circuit $102_{11}$.

Moreover, the delay adjustment circuit 10b can select whether or not to delay the signal OUT1 output from the selector $120_1$ by a half cycle of the clock CLKA by the FF circuit 103, the FF circuit 104, and the selector 130.

Therefore, by appropriately setting the number of the FF circuits $101_1$ for buffers and the number of the FF circuits $102_{11}$ selected by the selector $120_1$, it is possible to generate various half-period delays based on the clock CLKA.

3. First Modification Example of First Embodiment

Next, a first modification example of the first embodiment will be described. The first modification example of the first embodiment is an example in which, for example, the selector $120_1$ is incorporated in the FF circuit $102_{11}$ connected immediately before. Of course, the first modification example can also be applied to other selectors $120_2$ to $120_4$ and FF circuits $102_{22}$, $102_{34}$, and $102_{48}$ connected immediately before the selectors $120_2$ to $120_4$, respectively.

Figure 6A:
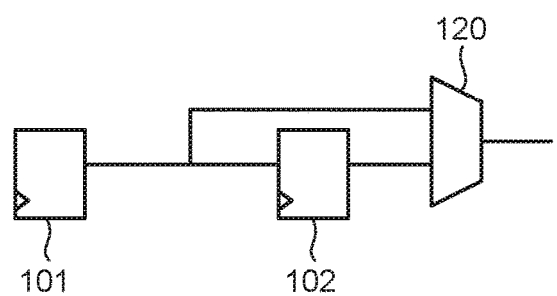
FIG. 6A is a schematic diagram for explaining a configuration according to a first modification example of the first embodiment.
Figure 6B:
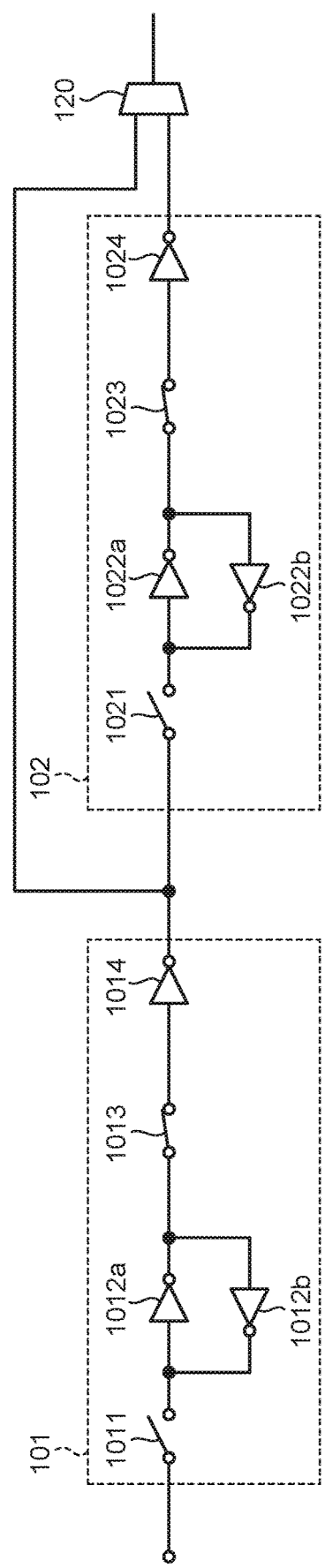
FIG. 6B is a schematic diagram for explaining a configuration according to a first modification example of the first embodiment.
Figure 6C:
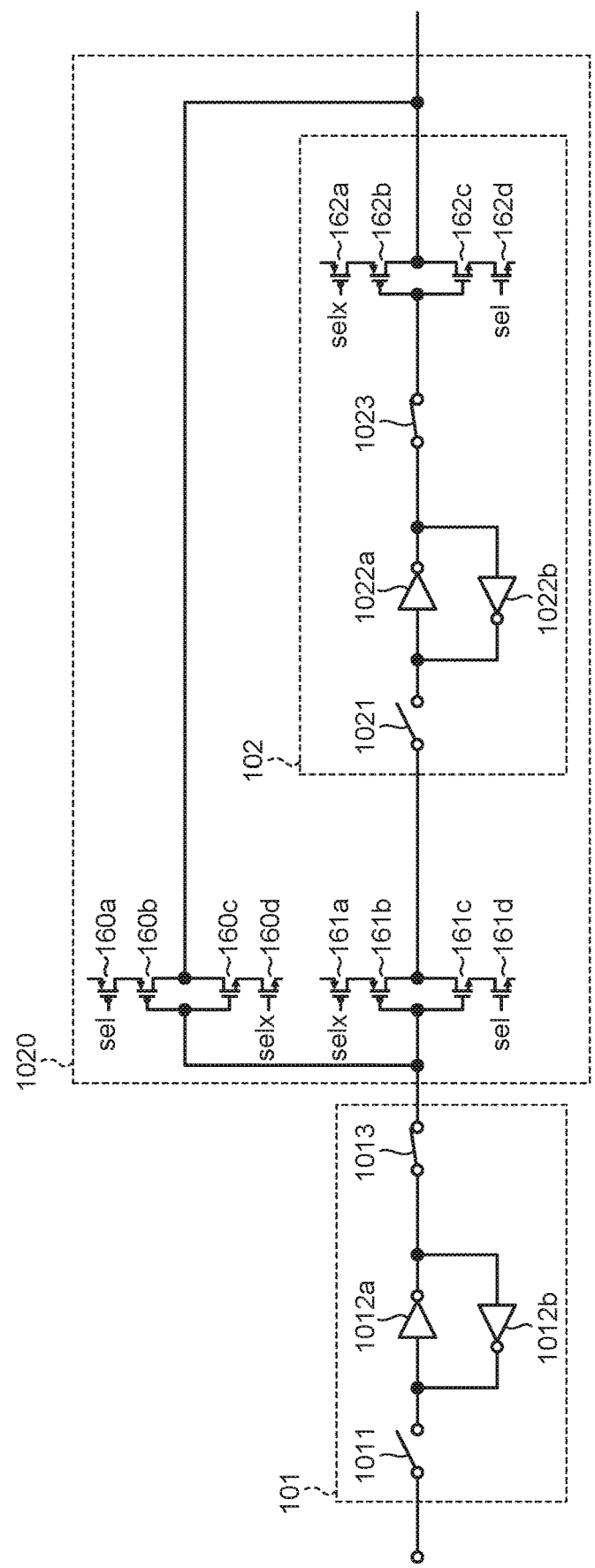
FIG. 6C is a schematic diagram for explaining a configuration according to a first modification example of the first embodiment.

FIGS. 6A, 6B, and 6C are schematic diagrams for explaining a configuration according to the first modification example of the first embodiment. FIG. 6A illustrates an example of an assumed circuit. Here, as illustrated in FIG. 6A, a configuration is assumed in which an output of the buffer FF circuit 101 is input to one input terminal of the selector 120 and the FF circuit 102, and an output of the FF circuit 102 is input to the other input terminal of the selector 120.

FIG. 6B is a circuit diagram of an example for realizing the configuration illustrated in FIG. 6A by a known technology. As illustrated in FIG. 6B, the FF circuit 101 can include two switch circuits $101_1$ and $101_3$ and three inverters $101_2a$, $101_2b$, and $101_4$. Similarly, the FF circuit 102 can include two switch circuits 1021 and 1023 and three inverters 1022a, 1022b, and 1024.

When the FF circuit 102 is described as an example, opening and closing of the switch circuits 1021 and 1023 are exclusively controlled according to a clock input to a clock input terminal. An input signal to the FF circuit 102 is input to the inverters $101_2a$ and $101_2b$ to which an input and an output are connected via the switch circuit 1021. Outputs of the inverters $101_2a$ and $101_2b$ are output from the FF circuit 102 via the switch circuit 1023 and the inverter 1024.

Since the configuration of the FF circuit 101 is the same as the configuration of the FF circuit 102, the description thereof is omitted here.

FIG. 6C is a circuit diagram of an example for realizing the configuration illustrated in FIG. 6A by the technology according to the first modification example of the first embodiment. An FF circuit 1020 with a selector includes an FF circuit 102 and two switch circuits including an inverter circuit by four transistors 160a to 160d and 161a to 161d, respectively. Furthermore, in FIG. 6C, the FF circuit 102 illustrates an inverter circuit on an output side as a configuration included in a switch circuit including four transistors 162a to 162d.

Hereinafter, for convenience, the switch circuit using the transistors 160a to 160d is referred to as a first switch circuit, the switch circuit using the transistors 161a to 161d is referred to as a second switch circuit, and the switch circuit using the transistors 162a to 162d is referred to as an output switch circuit.

In the first switch circuit, a signal sel is input to a gate of the transistor 160a which is a P-type metal oxide semiconductor (MOS) transistor, and a signal selx indicating a value exclusive of the signal sel is input to a gate of the transistor 160d which is an N-type MOS transistor. That is, by setting the signal sel to the low state and the signal selx to the high state, the inverter circuit including the transistors 160b and 160c enters the operating state. Furthermore, by setting the signal sel to the high state and the signal selx to the low state, the inverter circuit enters the non-operating state.

In the second switch circuit, the signal selx is input to a gate of the transistor 161a which is a P-type MOS transistor, and the signal sel is input to a gate of the transistor 161d which is an N-type MOS transistor. That is, by setting the signal sel to the low state and the signal selx to the high state, the inverter circuit including the transistors 161b and 161c becomes the non-operating state. Furthermore, by setting the signal sel to the high state and the signal selx to the low state, the inverter circuit enters the operating state.

As described above, the operating state and the non-operating state of the first switch circuit and the second switch circuit are exclusively controlled according to the signals sel and selx. Therefore, the operation of the selector 120 can be realized by combining the first switch circuit and the second switch circuit.

Note that the output switch circuit operates in the same manner as the second switch circuit. That is, the signal selx is input to a gate of the transistor 162a which is a P-type MOS transistor, and the signal sel is input to a gate of the transistor 162d which is an N-type MOS transistor. By setting the signal sel to the low state and the signal selx to the high state, the inverter circuit including the transistors 162b and 162c becomes the non-operating state. Furthermore, by setting the signal sel to the high state and the signal selx to the low state, the inverter circuit enters the operating state.

As described above, by incorporating the selector 120 into the FF circuit 102 connected immediately before to form the FF circuit 1020 with the selector, the delay in the selector 120 can be reduced as compared with the configuration according to the known technology illustrated in FIG. 6B, and the high-speed operation can be performed.

4. Second Modification Example of First Embodiment

Next, a second modification example of the first embodiment will be described. The second modification example of the first embodiment is an example in which the delay of the signal OUT1 in the delay adjustment circuit 10 illustrated in FIG. 2 is adjusted using CLKI that is an I phase (In Phase) clock and a clock CLKQ that is a Q phase (Quadrature Phase) clock having a phase different from the I phase by 90°.

Figure 7:
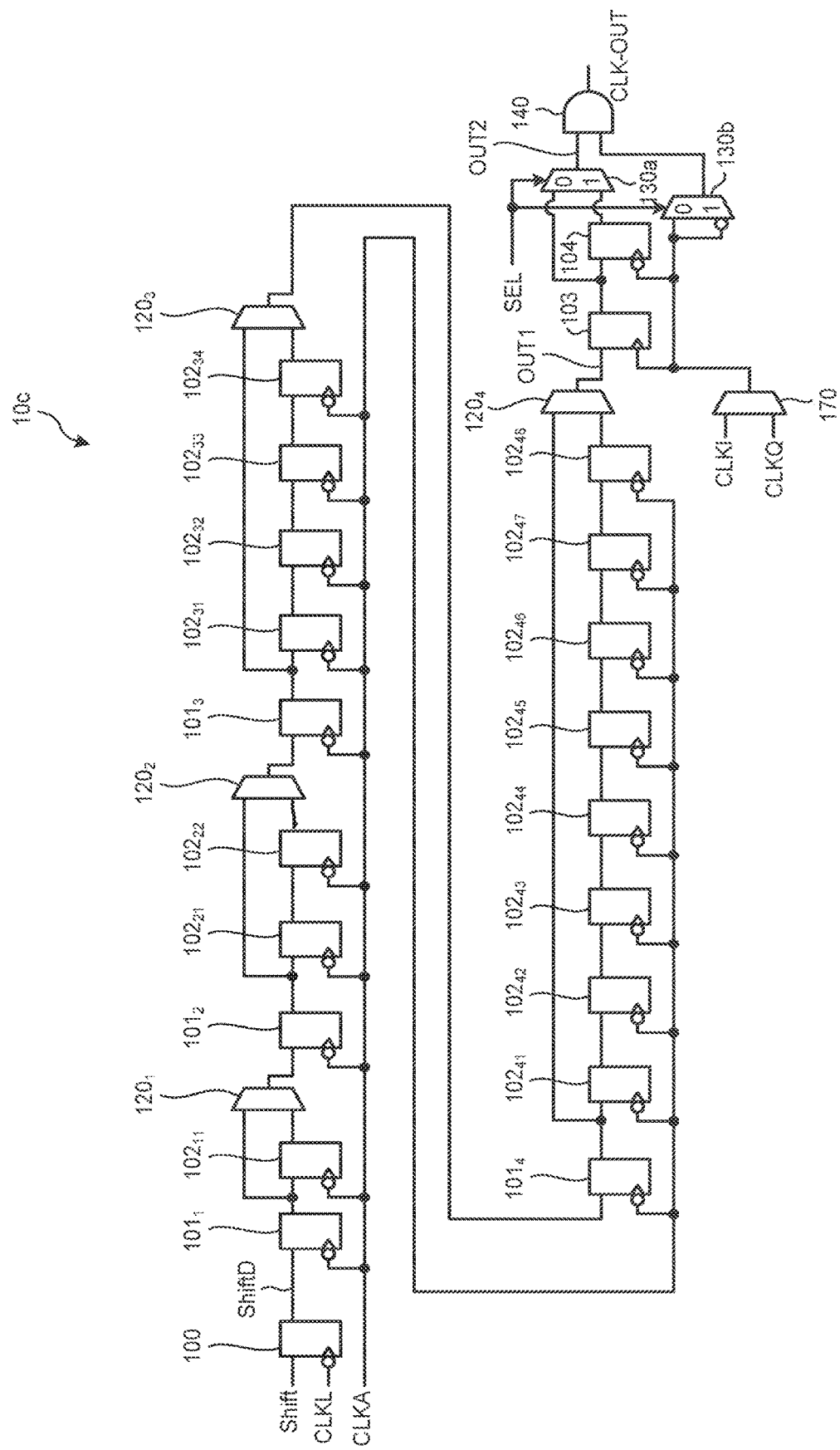
FIG. 7 is a circuit diagram illustrating a configuration of an example of a delay adjustment circuit according to a second modification example of the first embodiment.

FIG. 7 is a circuit diagram illustrating a configuration of an example of a delay adjustment circuit according to the second modification example of the first embodiment. The clock CLKI is input to one input terminal of a selector 170, and the clock CLKQ is input to the other input terminal. The output of the selector 170 is input to the clock input terminal of the FF circuit 103 in a non-inverted manner, and is input to the clock input terminal of the FF circuit 104 in an inverted manner. The output of the selector 170 is further input to the input terminal [0] of the selector 130b in a non-inverted manner and is input to the input terminal [1] in an inverted manner.

Figure 8A:
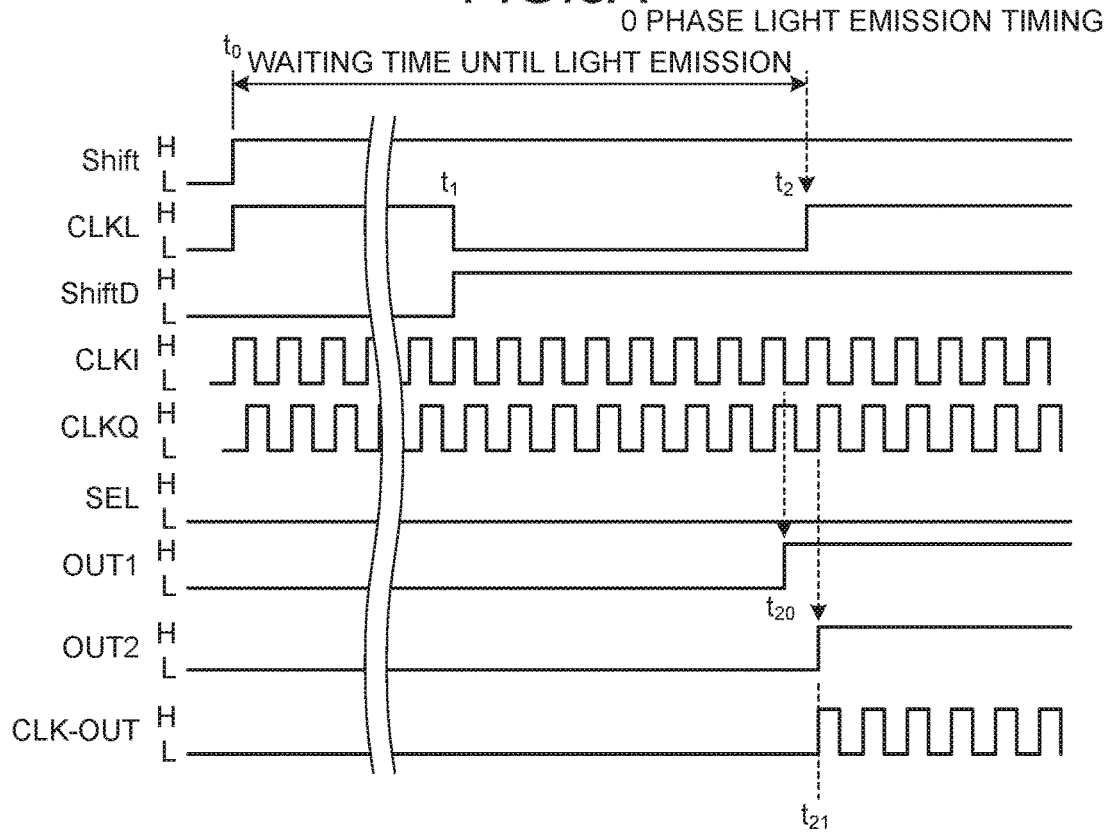
FIG. 8A is a timing chart illustrating an operation of an example of the delay adjustment circuit according to the second modification example of the first embodiment.
Figure 8B:
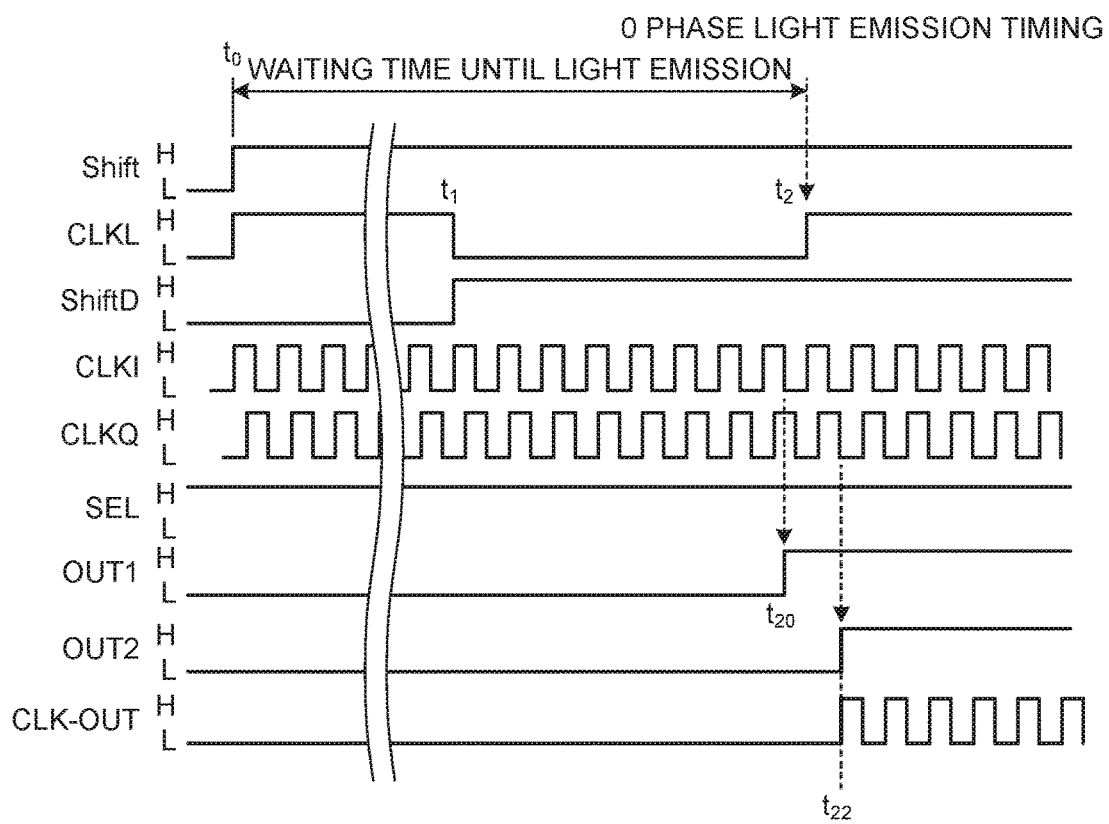
FIG. 8B is a timing chart illustrating an operation of an example of the delay adjustment circuit according to the second modification example of the first embodiment.

The operation of a delay adjustment circuit 10c according to the second modification example of the first embodiment will be described with reference to FIGS. 8A and 8B. FIGS. 8A and 8B are timing charts illustrating an operation of an example of the delay adjustment circuit 10c according to the second modification example of the first embodiment. In each of FIGS. 3A and 3B, the signal Shift, the clock CLKL, the signal ShiftD, the clock CLKI, the clock CLKQ, the signal SEL, the signal OUT1, the signal OUT2, and the output signal CLK-OUT are illustrated from the top.

Note that a length of one cycle of the clocks CLKI and CLKQ is assumed to be equal to a length of one cycle of the clock CLKA (not illustrated). Furthermore, it is assumed that the clock CLKI is in phase with the clock CLKA.

The timing chart illustrated in FIG. 8A illustrates an example in a case where the input terminal [0] is selected in each of the selectors 130a and 130b, and the other input terminal, that is, the clock CLKQ is selected in the selector 170. Similarly to the example of FIG. 3A, the signal OUT1 is a signal that rises at time $t_{20}$ that is half a period before the clock CLKA having the same phase as the clock CLKI with respect to time $t_2$.

Since the clock CLKQ is selected in the selector 170, the outputs of the FF circuits 103 and 104 are delayed by ¼ cycle of the clock CLKA with respect to the configuration of FIG. 2. Therefore, the output signal CLK-OUT output from the AND circuit 140 is enabled from time $t_{21}$ delayed by ¼ cycle of the clock CLKA with respect to time $t_{11}$ in FIG. 3A.

The timing chart illustrated in FIG. 8B illustrates an example in a case where the input terminal [1] is selected in each of the selectors 130a and 130b, and the other input terminal, that is, the clock CLKQ is selected in the selector 170. Similarly to the example of FIG. 3B, the signal OUT1 is a signal that rises at time $t_{20}$ that is half a period before the clock CLKA having the same phase as the clock CLKI with respect to time $t_2$.

Since the clock CLKQ is selected in the selector 170, the outputs of the FF circuits 103 and 104 are delayed by ¼ cycle of the clock CLKA with respect to the configuration of FIG. 2. Therefore, the output signal CLK-OUT output from the AND circuit 140 is enabled from time $t_{22}$ delayed by ¼ cycle of the clock CLKA with respect to time $t_{12}$ in FIG. 3B.

As described above, according to the second modification example of the first embodiment, by selecting the clock CLKQ by the selector 170, a delay of ¼ cycle of the clock CLKA can be given to the output signal CLK-OUT. Moreover, by selecting the other input terminal (the output side of the FF circuit 104) by the selector 130a, it is possible to apply a delay of ½ cycle of the clock CLKA to the output signal CLK-OUT. Therefore, by combining the switching of the selectors 130a and 130b and the switching of 170, it is possible to delay the output signal CLK-OUT in units of ¼ cycles of the clock CLKA.

5. Third Modification Example of First Embodiment

Next, a third modification example of the first embodiment will be described. The third modification example of the first embodiment is an example in which a delay circuit that gives a shorter delay to the delay unit of the delay adjustment circuit 10 is connected to the output of the delay adjustment circuit 10 according to the first embodiment.

Figure 9:
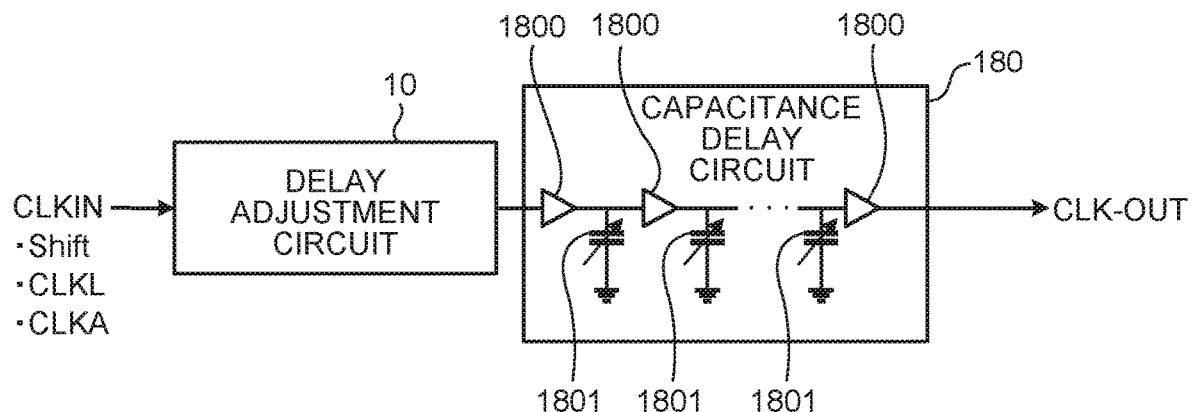
FIG. 9 is a schematic diagram illustrating an example of a configuration according to a third modification example of the first embodiment.

FIG. 9 is a schematic diagram illustrating an example of a configuration according to the third modification example of the first embodiment. In FIG. 9, the signal Shift, the clock CLKL, and the clock CLKA described above are input as an input signal CLKIN to the delay adjustment circuit 10. Since the operation of the delay adjustment circuit 10 is similar to the operation described with reference to FIGS. 3A and 3B, the description thereof will be omitted here.

A capacitance delay circuit 180 is connected to the output of the delay adjustment circuit 10. The capacitance delay circuit 180 includes two or more buffer circuits 1800 connected in series, and one or more variable capacitance 1801 having one end connected to a connection point between the buffer circuit 1800 and the next-stage buffer circuit 1800 and the other end grounded, for example. Each of the buffer circuits 1800 latches the input signal and outputs the latched signal at a predetermined timing.

In a case where, for example, a pulse signal is input to the buffer circuit 1800, when this signal is output from the buffer circuit 1800, a waveform of this signal is blunted by the variable capacitance 1801. The signal having the blunted waveform is input to the buffer circuit 1800 of the next stage. At this time, in the buffer circuit 1800 of the next stage, the timing of the latch is delayed due to blunting of the waveform of the signal to be latched.

The delay amount at this time changes according to the capacitance of the variable capacitance 1801, and as the capacitance increases, the blunting of the waveform increases and the delay amount also increases. On the other hand, as the capacitance decreases, the waveform rises steeply, so that the delay amount decreases.

Here, although depending on the capacitance of the variable capacitance 1801, the delay amount due to the blunting of the waveform corresponding to the variable capacitance 1801 is, for example, on the order of psec (picosecond). As an example, in a case where the delay amount according to the combination of the variable capacitance 1801 of one stage and the buffer circuit 1800 is 1 [psec], this configuration is connected in series in two stages, so that a delay of 2 [psec] can be given to the signal input to the capacitance delay circuit 180.

For example, in a case where the frequency of the clock CLKA input to the delay adjustment circuit 10 is 10 [MHz (megahertz)], one cycle=100 [psec]. As described above, the delay adjustment circuit 10 can adjust the delay with respect to the output signal CLK-OUT in ½ cycle of the clock CLKA, that is, in units of 50 [psec]. The delay circuit 180 can adjust a delay of the output signal CLK-OUT of the delay adjustment circuit 10 in the order of several [psec].

Therefore, the discrete delay amount by the delay adjustment circuit 10 can be filled with the delay amount by the delay circuit 180, and a delay circuit with higher resolution can be configured by using the delay adjustment circuit 10 and the delay circuit 180 in combination.

Note that, in the above description, the third modification example of the first embodiment has been described as being applied to the delay adjustment circuit 10 according to the first embodiment illustrated in FIG. 2, but this is not limited to this example. That is, the third modification example of the first embodiment can be similarly applied to the first and second modification examples of the first embodiment described above.

6. Fourth Modification Example of First Embodiment

Next, a fourth modification example of the first embodiment will be described. The fourth modification example of the first embodiment is an example in which the delay adjustment circuit 10 according to the first embodiment and a delay locked loop (DLL) circuit are combined.

Figure 10:
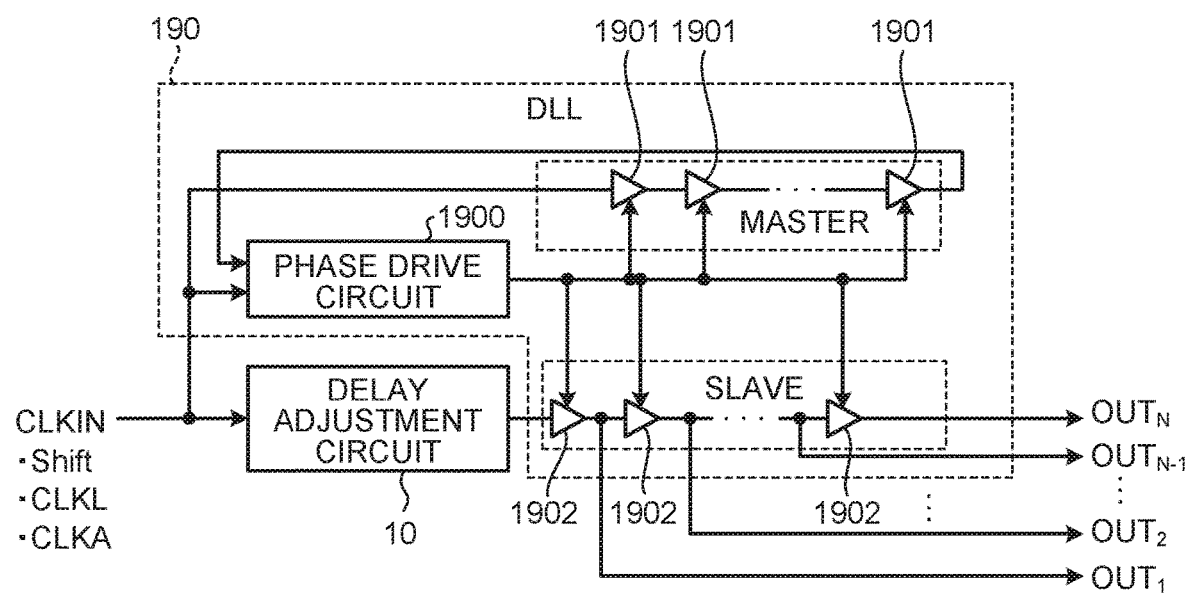
FIG. 10 is a schematic diagram illustrating an example of a configuration according to a fourth modification example of the first embodiment.

FIG. 10 is a schematic diagram illustrating an example of a configuration according to the fourth modification example of the first embodiment. In FIG. 9, the signal Shift, the clock CLKL, and the clock CLKA described above are input as an input signal CLKIN to the delay adjustment circuit 10. Since the operation of the delay adjustment circuit 10 is similar to the operation described with reference to FIGS. 3A and 3B, the description thereof will be omitted here.

In FIG. 10, the DLL circuit 190 includes a phase drive circuit 1900, a plurality of buffer circuits 1901 connected in series to perform a master operation, and a plurality of buffer circuits 1902 similarly connected in series to perform a slave operation with respect to the master operation. Among the input signals CLKIN, for example, the clock CLKA is input to one input terminal of the phase drive circuit 1900, and the buffer circuit 1901 at the foremost stage among the buffer circuits 1901 connected in series. Among the buffer circuits 1901 connected in series, an output of the buffer circuit 1901 at the last stage is input to the other input terminal of the phase drive circuit 1900 as a feedback signal for a signal input to the other input terminal of the phase drive circuit 1900.

The output of the delay adjustment circuit 10 is input to the buffer circuit 1902 at the foremost stage among the plurality of buffer circuits 1902 connected in series. Each of the buffer circuits 1901 and each of the buffer circuits 1902 gives a delay by a delay amount according to a supplied control voltage to the input signal and outputs the signal.

The phase drive circuit 1900 includes a phase comparator and a voltage generation unit that generates an output voltage according to an output of the phase comparator. As the voltage generation unit, for example, a charge pump can be applied. The phase drive circuit 1900 compares a phase of the signal input to one input terminal with a phase of the signal input to the other input terminal, and outputs a voltage corresponding to the comparison result. The voltage output from the phase drive circuit 1900 is supplied to each of the buffer circuits 1901 that performs the master operation and each of the buffer circuits 1902 that performs the slave operation as a control voltage for controlling the delay amount.

In such a configuration, the phase drive circuit 1900 operates to match a phase of the signal (for example, the clock CLKA) input to one input terminal with a phase of the feedback signal input to the other input terminal. Each of the buffer circuits 1901 can obtain a phase difference at equal intervals between the buffer circuits 1901 according to the output of the phase drive circuit 1900.

On the other hand, as described above, the output voltage of the phase drive circuit 1900 is input to each of the buffer circuits 1901 that performs the slave operation on each of the buffer circuits 1902 as a control voltage for controlling the delay amount, similarly to each of the buffer circuits 1901. Therefore, in each of the buffer circuits 1902, similarly to each of the buffer circuits 1901 described above, it is possible to obtain a phase difference at equal intervals between the buffer circuits 1902.

Therefore, output signals $OUT_1, OUT_2, \ldots, OUT_{N-1}$, and $OUT_N$, which are the outputs of the respective buffer circuits 1902, are signals delayed with a resolution corresponding to the number of buffer circuits 1902 connected in series. For example, in a case where the 10 buffer circuits 1902 are connected in series, the output signals $OUT_1, OUT_2, \ldots, OUT_{N-1}$, and $OUT_N$ become signals whose phases are shifted by 1/10 cycles from the phase of the clock (for example, the clock CLKA) input as the input signal CLKIN.

By using the delay adjustment circuit 10 and the DLL circuit 190 in combination as described above, a delay circuit with higher resolution can be configured.

Note that, in the above description, the fourth modification example of the first embodiment has been described as being applied to the delay adjustment circuit 10 according to the first embodiment illustrated in FIG. 2, but this is not limited to this example. That is, the fourth modification example of the first embodiment can be similarly applied to the first and second modification examples of the first embodiment described above.

7. Second Embodiment of Present Disclosure

Next, a second embodiment of the present disclosure will be described. According to the second embodiment of the present disclosure, the delay adjustment circuit 10 according to the first embodiment described above includes a floating tap type decision feedback equalizer (DFE; determination feedback equalizer).

Schematically, the DFE sequentially delays the output signal by a multistage delay circuit, multiplies the output (tap) of each delay circuit by a coefficient, feeds back the result to the input signal, and adds the result. In the floating tap type DFE, one delay circuit is used instead of the multistage delay circuit, and the delay amount of the delay circuit is changed according to the tap. Hereinafter, the floating tap type DFE will be simply described as a DFE unless otherwise specified.

Figure 11:
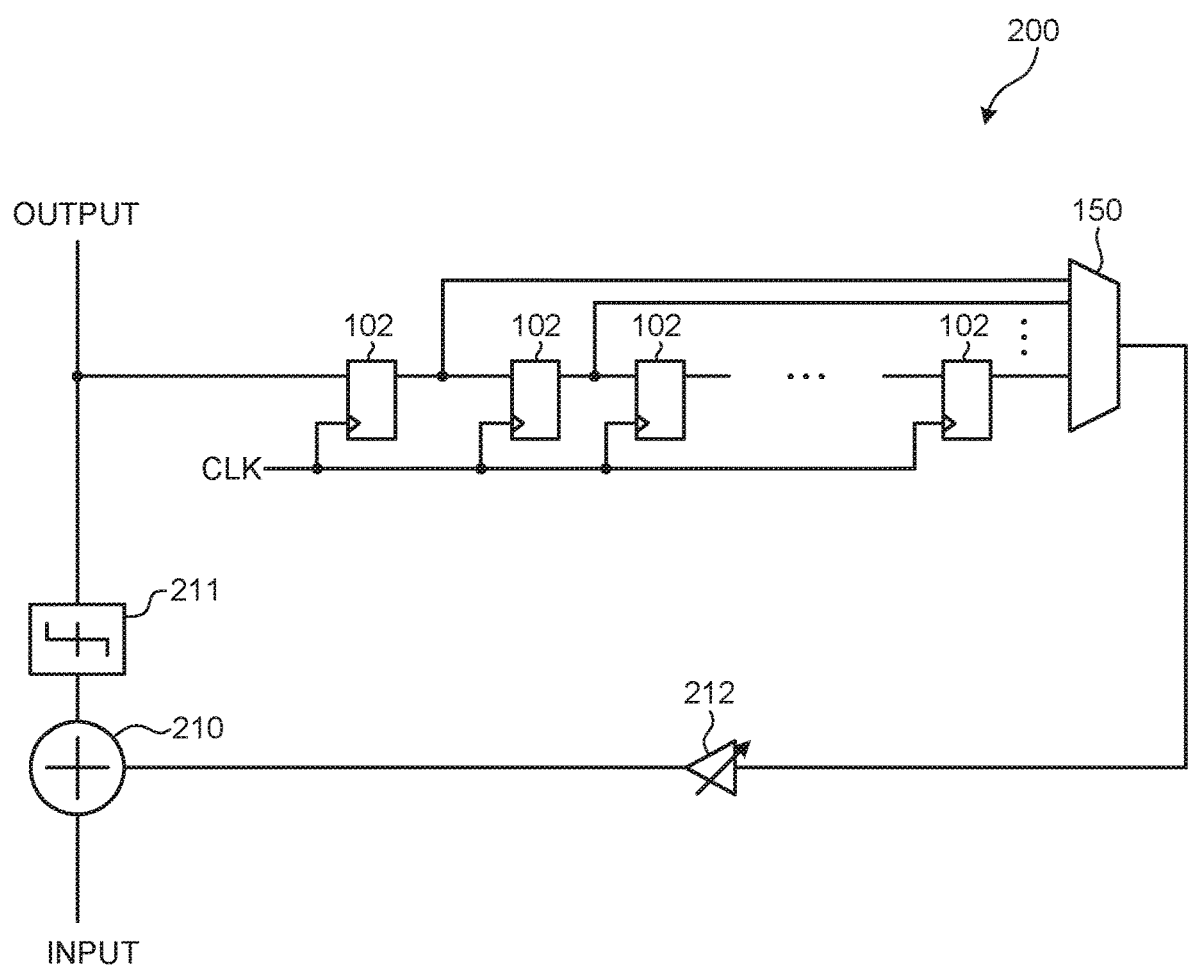
FIG. 11 is a circuit diagram illustrating an example in which a delay adjustment circuit according to an existing technology is applied to a DFE.

FIG. 11 is a circuit diagram illustrating an example in a case where the delay adjustment circuit 10a according to the existing technology described with reference to FIG. 4 is applied to the DFE. In FIG. 11, a DFE 200 includes an adder 210, a sampler 211, a coefficient multiplier 212, a plurality of FF circuits 102 connected in series, and a selector 150.

In FIG. 11, the DFE 200 adds a signal obtained by multiplying the output of the selector 150 having a plurality of input terminals by a coefficient by the coefficient multiplier 212 to the input signal by the adder 210. The addition output by the adder 210 is sampled by the sampler 211 and output as an output signal of the DFE 200, and is input to a data input terminal of the FF circuit 102 at the foremost stage among the FF circuits 102 connected in series.

The clock CLK is input to a clock input terminal of each of the FF circuits 102. Each of the FF circuits 102 gives a delay corresponding to the clock CLK to the signal input to the data input terminal and outputs the signal. The signal output from each of the FF circuits 102 is passed to the FF circuit 102 of the next stage (in a case other than the FF circuit 102 of the last stage), and is input to each of the plurality of input terminals of the selector 150.

In the configuration illustrated in FIG. 11, by selecting one from a plurality of input terminals included in the selector 150, a delay corresponding to the selected input terminal can be obtained. However, as described with reference to FIG. 4, since the switches of the respective input terminals appear as loads when viewed from a side of the selector 150, the waveform of the output signal of the selector 150 may be blunted, and it is difficult to operate at a high speed.

Figure 12:
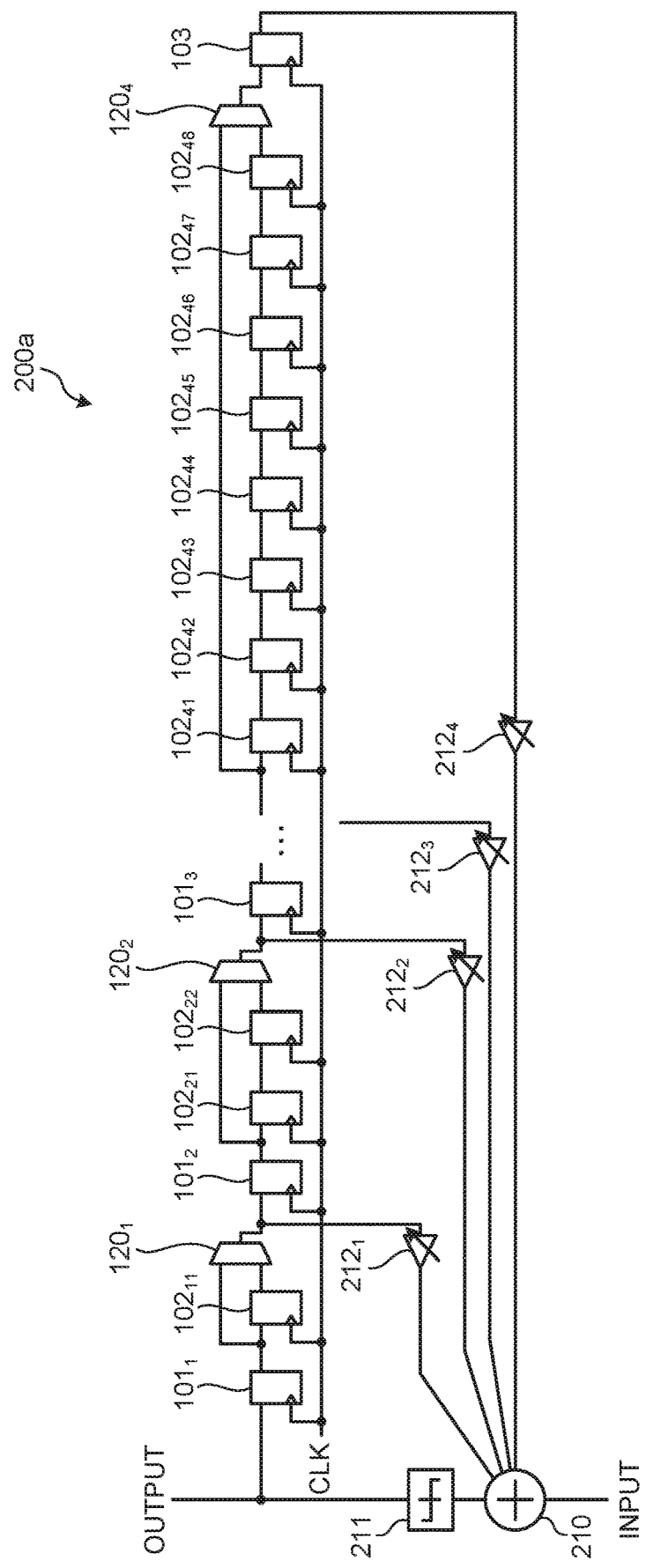
FIG. 12 is a circuit diagram of an example of a DFE according to a second embodiment.

FIG. 12 is a circuit diagram of an example of a DFE according to the second embodiment. A DFE 200a illustrated in FIG. 12 is an example in which the delay adjustment circuit 10 according to the first embodiment illustrated in FIG. 2 is applied to a DFE.

In FIG. 12, the DFE 200a includes an adder 210, a sampler 211, coefficient multipliers $212_1$ to $212_3$, FF circuits $101_1$ to $101_4$ as a buffer, FF circuits $102_{11}$ to $102_{48}$ as a delay circuit, an FF circuit 103 as an output unit, and selectors $120_1$ to $120_4$. Note that, in FIG. 12, the FF circuits $102_{31}$ to $102_{34}$ as the delay circuit and the FF circuit $101_4$ as the buffer illustrated in FIG. 2 are omitted. A clock CLK is input to a clock input terminal of each of the FF circuits $101_1$ to $101_4$, the FF circuits $102_{11}$ to $102_{48}$, and the FF circuit 103.

An output of the selector $120_1$ is input to the adder 210 via the coefficient multiplier $212_1$. An output of the selector $120_2$ is input to the adder 210 via the coefficient multiplier $212_2$. An output of the selector $120_3$ (not illustrated) is input to the adder 210 via the coefficient multiplier $212_3$. Furthermore, an output of the selector $120_4$ is input to the adder 210 via the FF circuit 103 and the coefficient multiplier $212_1$.

The adder 210 adds the outputs of the coefficient multipliers $212_1$ to $212_4$ to the input signal and passes the input signal to the sampler 211.

In the configuration illustrated in FIG. 12, for example, by setting the value of any coefficient of the coefficient multipliers $212_1$ to $212_4$ to a predetermined value other than 0 and setting the values of the other coefficients to 0, it is possible to extract a signal delayed by 2 clocks, 5 clocks, 10 clocks, or 20 clocks of the clock CLK.

In this case, the number of input terminals included in each of the selectors $120_1$ to $120_4$ is two, and is smaller than the number of input terminals included in the selector 150 used in the example to which the existing technology illustrated in FIG. 11 is applied. Therefore, in the configuration illustrated in FIG. 12, the load in each of the selectors $120_1$ to $120_4$ can be suppressed, and a high-speed operation can be performed as compared with the example to which the existing technology illustrated in FIG. 11 is applied.

8. Third Embodiment of Present Disclosure

Next, a third embodiment of the present disclosure will be described. The third embodiment is an example in which the delay adjustment circuit 10 described in the first embodiment is applied to a distance measuring device that performs distance measurement by the above-described indirect ToF.

8-1. Schematic Description of Indirect ToF

First, the distance measurement by the indirect ToF will be schematically described.

Figure 13:
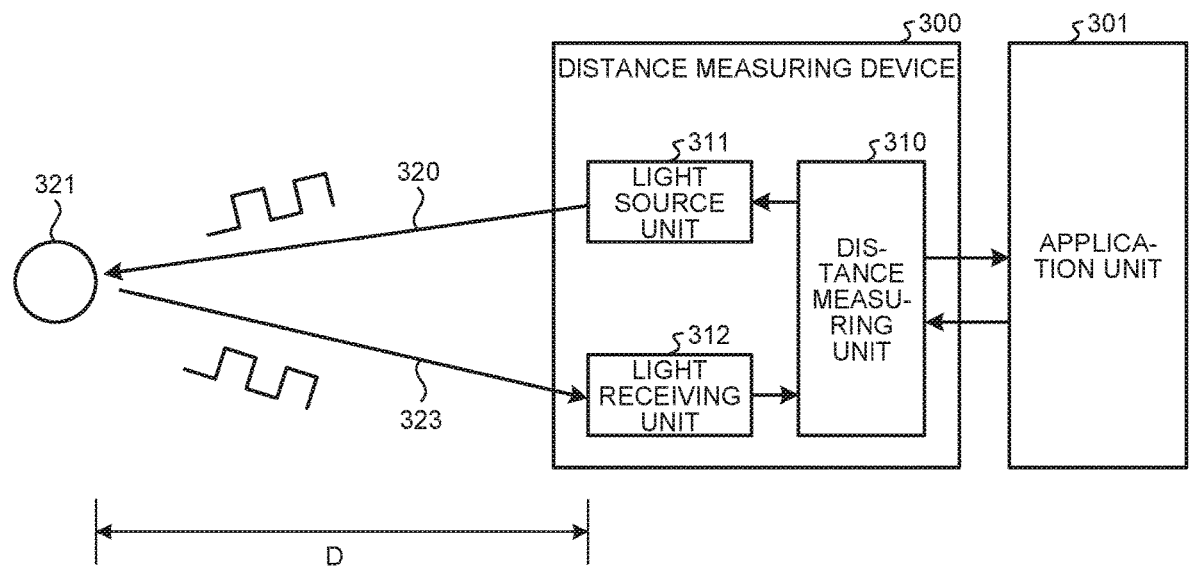
FIG. 13 is a block diagram illustrating a configuration of an example of a distance measuring device applicable to a third embodiment.

FIG. 13 is a block diagram illustrating a configuration of an example of a distance measuring device applicable to the third embodiment. In FIG. 13, an application unit 301 is realized, for example, by a program operating on a central processing unit (CPU), requests a distance measuring device 300 to execute distance measurement, and receives distance information or the like which is a result of the distance measurement from the distance measuring device 300.

The distance measuring device 300 includes a light source unit 311, a light receiving unit 312, and a distance measuring unit 310. The light source unit 311 includes, for example, a light emitting element that emits light having a wavelength in an infrared region, and a drive circuit that drives the light emitting element to emit light. As the light emitting element included in the light source unit 311, a vertical cavity surface emitting laser (VCSEL) which is a surface light source in which a plurality of light emitting elements is formed in an array can be applied. The present disclosure is not limited thereto, and light emitting diodes (LEDs) arranged in an array may be applied as the light emitting element included in the light source unit 311.

Hereinafter, unless otherwise specified, "the light emitting element of the light source unit 311 emits light" will be described as "the light source unit 311 emits light" or the like.

The light receiving unit 312 includes, for example, a plurality of light receiving elements capable of detecting light having a wavelength in an infrared region, and a signal processing circuit that outputs a pixel signal corresponding to the light detected by each of the plurality of light receiving elements. The plurality of light receiving elements is arranged in an array in the light receiving unit 312 to form a light receiving surface. A photodiode can be applied as the light receiving element included in the light receiving unit 312. Hereinafter, unless otherwise specified, "the light receiving element included in the light receiving unit 312 receives light" will be described as "the light receiving unit 312 receives light" or the like.

The distance measuring unit 310 executes distance measuring processing in the distance measuring device 300 in response to a distance measuring instruction from the application unit 301, for example. For example, the distance measuring unit 310 generates a light source control signal for driving the light source unit 311 and supplies the light source control signal to the light source unit 311. Furthermore, the distance measuring unit 310 controls light reception by the light receiving unit 312 in synchronization with a light source control signal supplied to the light source unit 311. For example, the distance measuring unit 310 generates an exposure control signal for controlling an exposure period in the light receiving unit 312 in synchronization with the light source control signal, and supplies the generated signal to the light receiving unit 312. The light receiving unit 312 outputs a valid pixel signal within the exposure period indicated by the exposure control signal.

The distance measuring unit 310 calculates distance information on the basis of a pixel signal output from the light receiving unit 312 in response to light reception. Furthermore, the distance measuring unit 310 can also generate predetermined image information on the basis of the pixel signal. The distance measuring unit 310 passes distance information and image information calculated and generated on the basis of the pixel signal to the application unit 301.

In such a configuration, the distance measuring unit 310 generates a light source control signal for driving the light source unit 311 in accordance with an instruction to execute distance measurement from the application unit 301, for example, and supplies the light source control signal to the light source unit 311. Here, the distance measuring unit 310 generates a light source control signal modulated into a rectangular wave having a predetermined duty by PWM, and supplies the light source control signal to the light source unit 311. At the same time, the distance measuring unit 310 controls light reception by the light receiving unit 312 on the basis of an exposure control signal synchronized with the light source control signal.

In the distance measuring device 300, the light source unit 311 blinks and emits light in accordance with to a predetermined duty according to the light source control signal generated by the distance measuring unit 310. The light emitted from the light source unit 311 is emitted from the light source unit 311 as emission light 320. The emission light 320 is reflected by an object to be measured 321, for example, and is received by the light receiving unit 312 as a reflected light 323. The light receiving unit 312 supplies a pixel signal corresponding to the reception of the reflected light 323 to the distance measuring unit 310. Note that, in practice, the light receiving unit 312 receives ambient environmental light in addition to the reflected light 323, and the pixel signal includes a component of the ambient light together with a component of the reflected light 323.

The distance measuring unit 310 executes light reception by the light receiving unit 312 a plurality of times in different phases. The distance measuring unit 310 calculates a distance D to the object to be measured based on a difference between pixel signals due to light reception at different phases. Furthermore, the distance measuring unit 310 calculates first image information obtained by extracting a component of the reflected light 323 on the basis of a difference between the pixel signals, and second image information including a component of the reflected light 323 and a component of the ambient light. Hereinafter, the first image information is referred to as direct reflected light information, and the second image information is referred to as RAW image information.

Distance Measurement by Indirect ToF Method Applicable to Each Embodiment

Figure 14:
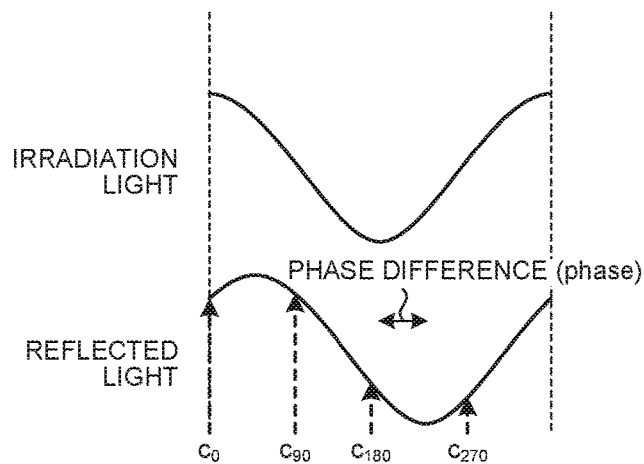
FIG. 14 is a diagram for explaining the principle of an indirect ToF method.

Next, distance measurement by the indirect ToF method applicable to each embodiment will be described. FIG. 14 is a diagram for explaining the principle of the indirect ToF method. In FIG. 14, light modulated by a sine wave is used as the emission light 320 emitted from the light source unit 311. Ideally, the reflected light 323 is a sine wave having a phase difference phase corresponding to the distance D with respect to the emission light 320.

The distance measuring unit 310 performs a plurality of times of sampling on the pixel signal that has received the reflected light 323 at different phases, and acquires a light amount value indicating the light amount for each sampling. In the example of FIG. 14, light amount values $C_0$, $C_{90}$, $C_{180}$, and $C_{270}$ are acquired in phases of a phase of 0°, a phase of 90°, a phase of 180°, and a phase of 270°, which are different from the phase of the emission light 320 by 90°, respectively. In the indirect ToF method, distance information is calculated on the basis of a difference between light amount values of a set having phases different by 180° among the phases of 0°, 90°, 180°, and 270°.

Figure 15:
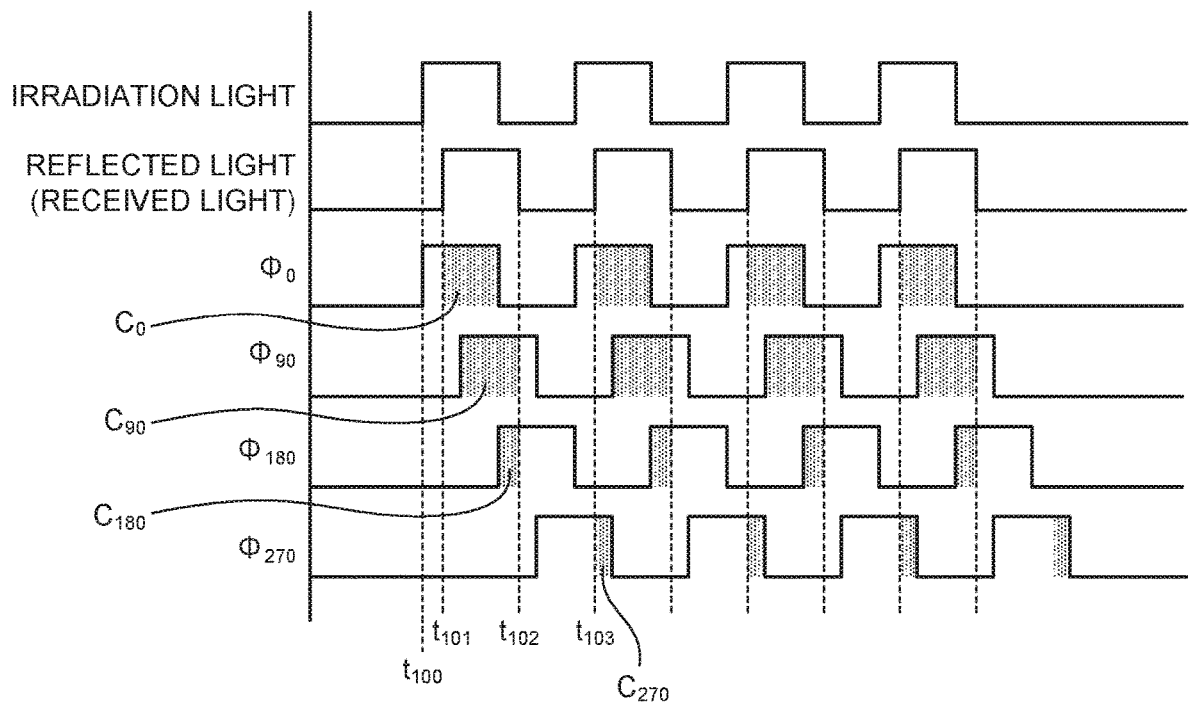
FIG. 15 is a diagram illustrating an example of a case where emission light from a light source unit is a rectangular wave modulated by PWM.

A method of calculating the distance information in the indirect ToF method will be described more specifically with reference to FIG. 15. FIG. 15 is a diagram illustrating an example of a case where the emission light 320 from the light source unit 311 is a rectangular wave modulated by PWM. In FIG. 15, the emission light 320 from the light source unit 311 and the reflected light 323 reaching the light receiving unit 312 are illustrated from the upper side. As illustrated in the upper side of FIG. 15, the light source unit 311 periodically flashes at a predetermined duty to emit the emission light 320.

FIG. 15 further illustrates exposure control signals $\Phi_0$, $\Phi_{90}$, $\Phi_{180}$, and $\Phi_{270}$ at a phase of 0°, a phase of 90°, a phase of 180°, and a phase of 270° of the light receiving unit 312, respectively. For example, a period during which the exposure control signal is in a high state is an exposure period during which the light receiving unit 312 outputs a valid pixel signal.

In the example of FIG. 15, the emission light 320 is emitted from the light source unit 311 at a time point $t_{100}$, and the reflected light 323 obtained by reflecting the emission light 320 by the object to be measured reaches the light receiving unit 312 at a time point $t_{101}$ after a delay corresponding to the distance D from the time point $t_{100}$ to the object to be measured.

On the other hand, in accordance with the exposure control signal from the distance measuring unit 310, the light receiving unit 312 starts the exposure period with the phase of 0° in synchronization with the time point $t_{100}$ of the emission timing of the emission light 320 in the light source unit 311. Similarly, the light receiving unit 312 starts the exposure periods of the phase of 90°, the phase of 180°, and the phase of 270° in accordance with the exposure control signal from the distance measuring unit 310. Here, the exposure period in each phase follows the duty of the emission light 320. Note that, in the example of FIG. 15, the exposure periods of the respective phases are illustrated as being temporally parallel for the sake of explanation, but actually, in the light receiving unit 312, the exposure periods of the respective phases are sequentially designated, and the light amount values $C_0$, $C_{90}$, $C_{180}$, and $C_{270}$ of the respective phases are acquired.

In the example of FIG. 15, the arrival timing of the reflected light 323 is time points $t_{101}$, $t_{102}$, $t_{103}$, . . . , and the light amount value $C_0$ at the phase 0° is acquired as an integral value of the received light amounts from the time point $t_{100}$ to the end time point of the exposure period including the time point $t_{100}$ at the phase 0°. On the other hand, in the phase 180° in which the phase is different from the phase 0° by 180°, the light amount value $C_{180}$ is acquired as an integral value of the received light amounts from the start time point of the exposure period at the phase 180° to the time point $t_{102}$ of the fall of the reflected light 323 included in the exposure period.

For the phase of 90° and the phase of 270° that is different from the phase of 90° by 180°, similarly to the case of the phases of 0° and 180° described above, the integrated value of the amounts of received light in the period in which the reflected light 323 arrives within each exposure period is acquired as the light amount values $C_{90}$ and $C_{270}$.

Among these light amount values $C_0$, $C_{90}$, $C_{180}$, and $C_{270}$, as illustrated in the following Formulas (1) and (2), a difference I and a difference Q are obtained on the basis of a combination of light amount values having phases different by 180°.

$$I = C_0 - C_{180} \tag{1}$$

$$Q = C_{90} - C_{270} \tag{2}$$

Based on these differences I and Q, a phase difference phase is calculated by the following Formula (3). Mote that, in the Formula (3), the phase difference phase is defined in a range of (0≤phase<2π).

$$\text{phase} = \tan^{-1}(Q/I) \tag{3}$$

Distance information Depth is calculated by the following Formula (4) using the phase difference phase and a predetermined coefficient range.

$$\text{Depth} = (\text{phase} \times \text{range})/2\pi \tag{4}$$

Furthermore, based on the differences I and Q, the component of the reflected light 323 (directly reflected light information) can be extracted from the component of the light received by the light receiving unit 312. Direct reflected light information DiRefl is calculated by the following Formula (5) using absolute values of the differences I and Q.

$$\text{DiRefl} = |I| + |Q| \tag{5}$$

Note that the direct reflected light information DiRefl is also referred to as Confidence information, and can also be expressed as the following Formula (6).

$$\text{Confidence} = \sqrt{I^2} + \sqrt{Q^2} \tag{6}$$

The RAW image information RAW can be calculated as an average value of the light amount values $C_0$, $C_{90}$, $C_{180}$, and $C_{270}$ as illustrated in the following Formula (7).

$$\text{RAW} = (C_0 + C_{90} + C_{180} + C_{270})/4 \tag{7}$$

8-2. Configuration Example for Implementing Indirect ToF

Figure 16:
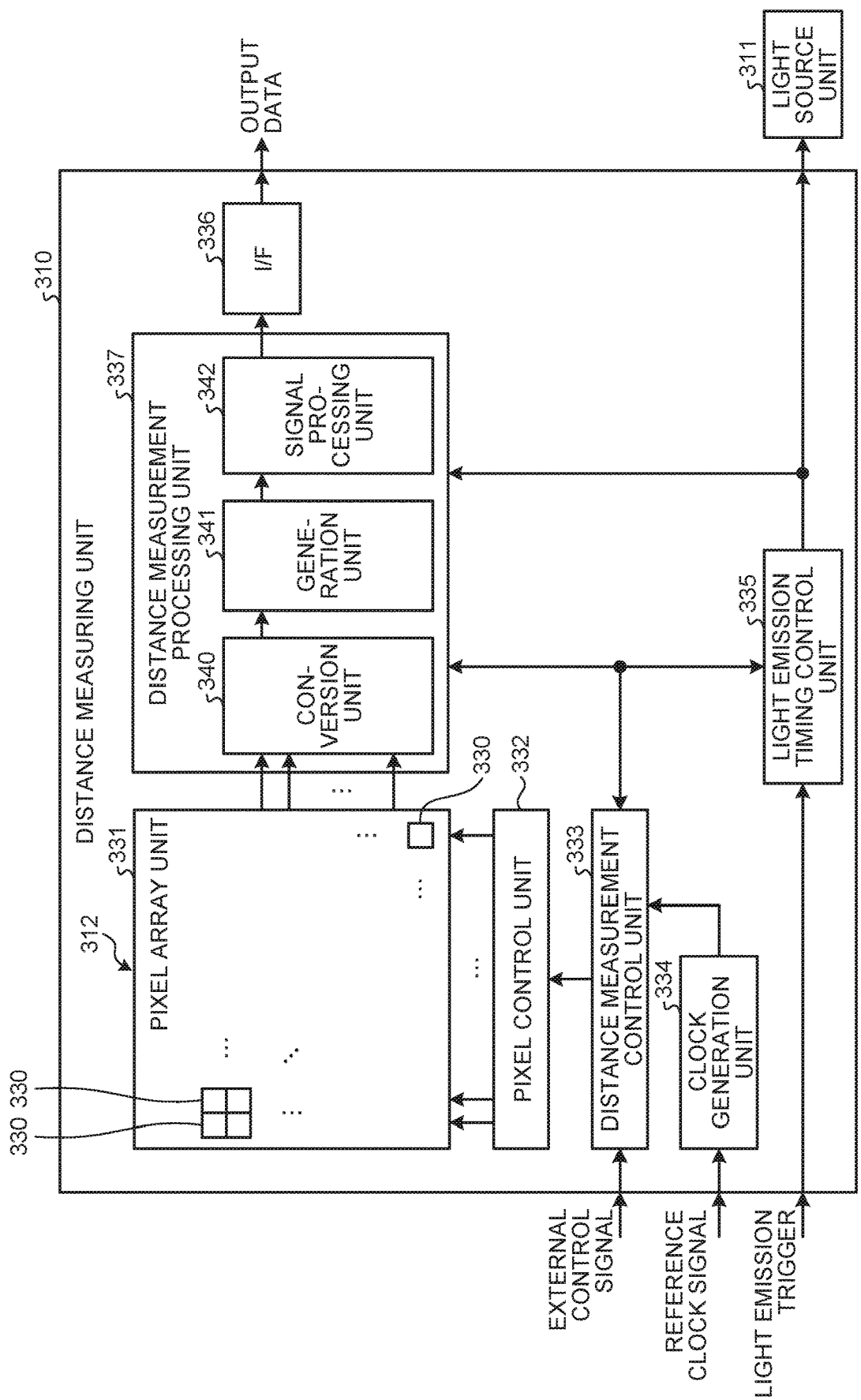
FIG. 16 is a block diagram illustrating a configuration example of the distance measuring unit applicable to the third embodiment in more detail.

Next, a configuration example of a distance measuring device applicable to the third embodiment will be described. FIG. 16 is a block diagram illustrating a configuration example of a distance measuring unit 310 applicable to the third embodiment in more detail. In FIG. 16, the distance measuring unit 310 includes a pixel array unit 331, a distance measurement processing unit 337, a pixel control unit 332, a distance measurement control unit 333, a clock generation unit 334, a light emission timing control unit 335, and an interface (I/F) 336. The pixel array unit 331, the distance measurement processing unit 337, the pixel control unit 332, the distance measurement control unit 333, the clock generation unit 334, the light emission timing control unit 335, and the interface 336 are arranged on one semiconductor chip, for example.

In FIG. 16, the distance measurement control unit 333 controls the entire operation of the distance measuring unit 310 according to, for example, a program incorporated in advance. Furthermore, the distance measurement control unit 333 can also execute control according to an external control signal supplied from the outside (for example, an overall control unit that performs overall control of the distance measuring device 300).

The clock generation unit 334 generates one or more clock signals used in the distance measuring unit 310 on the basis of a reference clock signal (for example, the clock CLKL) supplied from the outside. For example, the clock generation unit 334 can generate the clock CLKA by dividing the clock CLKL. The clock CLKL and the clock CLKA are supplied to the light emission timing control unit 335 via the distance measurement control unit 333.

The light emission timing control unit 335 to which the delay adjustment circuit 10 described in the first embodiment is applied generates a light emission control signal (for example, an output signal CLK-OUT) indicating a light emission timing and a light emission duration according to a light emission trigger signal (for example, a signal Shift) supplied from the outside. The light emission trigger signal is supplied, for example, in synchronization with the rise of the reference clock signal described above. The light emission control signal is supplied to the light source unit 311 and also supplied to the distance measurement processing unit 337.

The pixel array unit 331 includes a plurality of pixel circuits 330 each including a light receiving element and arranged in a matrix array. An operation of each of the pixel circuits 330 is controlled by the pixel control unit 332 according to an instruction of the distance measurement control unit 333. For example, the pixel control unit 332 can control reading of the pixel signal from each pixel circuit 330 for each block including (p×q) pixel circuits 330 of p in a row direction and q in a column direction. Furthermore, the pixel control unit 332 can scan each of the pixel circuits 330 in the row direction and further scan in the column direction in units of the block, and read the pixel signal from each of the pixel circuits 330. The present disclosure is not limited thereto, and the pixel control unit 332 can independently control each of the pixel circuits 330.

Moreover, the pixel control unit 332 can set a predetermined region of the pixel array unit 331 as a target region, and set the pixel circuit 330 included in the target region as a target pixel circuit 330 from which a pixel signal is read. Furthermore, the pixel control unit 332 can scan a plurality of rows (a plurality of lines) collectively, further scan the rows in the column direction, and read the pixel signal from each of the pixel circuits 330.

The pixel signal read from each of the pixel circuits 330 is supplied to the distance measurement processing unit 337. The distance measurement processing unit 337 includes a conversion unit 340, a generation unit 341, and a signal processing unit 342.

The pixel signal read from each of the pixel circuits 330 and output from the pixel array unit 331 is supplied to the conversion unit 340. Here, the pixel signal is asynchronously read from each of the pixel circuits 330 included in the target region and supplied to the conversion unit 340. That is, the pixel signal is read and output from the light receiving element according to the timing at which the light is received in each of the pixel circuits 330 included in the target region.

The conversion unit 340 converts the pixel signal supplied from the pixel array unit 331 into digital information. That is, the pixel signal supplied from the pixel array unit 331 is output corresponding to the timing at which the light is received by the light receiving element included in the pixel circuit 330 corresponding to the pixel signal. The conversion unit 340 converts the supplied pixel signal into time information indicating the timing.

The generation unit 341 generates a histogram on the basis of the time information obtained by converting the pixel signal by the conversion unit 340. Here, the generation unit 341 includes a counter, classifies the time information on the basis of a class (bin (bins)) corresponding to the unit time $T_P$ set in advance, counts the time information by the counter for each bin, and generates a histogram.

The signal processing unit 342 performs predetermined arithmetic processing on the basis of the histogram data generated by the generation unit 341, and calculates, for example, distance information. For example, the signal processing unit 342 obtains a light amount N received at the unit time $T_P$ based on the histogram data generated by the generation unit 341. The signal processing unit 342 can obtain the distance D on the basis of the light amount N.

The distance measurement data indicating the distance D obtained by the signal processing unit 342 is supplied to the interface 336. The interface 336 outputs the distance measurement data supplied from the signal processing unit 342 to the outside as output data. As the interface 336, for example, a mobile industry processor interface (MIPI) can be applied.

Note that, in the above description, the distance measuring data indicating the distance D obtained by the signal processing unit 342 is output to the outside via the interface 336, but this is not limited to this example. That is, histogram data that is the data of the histogram generated by the generation unit 341 may be output from the interface 336 to the outside. The histogram data output from the interface 336 is supplied to, for example, an external information processing apparatus and processed as appropriate.

In the above-described configuration, by applying the delay adjustment circuit 10 described in the first embodiment to the light emission timing control unit 335, the light emission timing in the light source unit 311 according to the input of the light emission trigger can be changed with a higher degree of freedom. By controlling the light emission timing with a high degree of freedom, the distance measurement can be made with high accuracy. Furthermore, the light emission timing by the light source unit 311 is affected by voltage fluctuation and a temperature environment, but it is also possible to adjust the light emission timing by the influence.

Moreover, since the load of processing in the light emission timing control unit 335 is reduced, faster processing can be performed, and the distance measurement can be performed with higher accuracy.

Note that the effects described in the present specification are merely examples and are not limited, and other effects may be provided.

Note that the present technique can also have the following configurations.

(1) A delay adjustment circuit comprising:
    a plurality of delay adjustment units connected in series, each of the delay adjustment units including one or more first delay elements connected in series that delay an input signal based on a clock, and a first selector that outputs one of the input signal and an output of the first delay element at a last stage among the one or more first delay elements; and an output unit that outputs the clock according to an output of the first selector included in a delay adjustment unit of a last stage among the plurality of delay adjustment units,
wherein each of the plurality of delay adjustment units includes
a different number of the first delay elements.
(2) The delay adjustment circuit according to the above (1), wherein
each of the plurality of delay adjustment units further includes one or more second delay elements that delay the input signal based on the clock, and input the delayed input signal to a first delay element at a foremost stage among the one or more first delay elements and the first selector.
(3) The delay adjustment circuit according to the above (1) or (2), wherein
each of the plurality of delay adjustment units includes a power-of-two number of the first delay elements.
(4) The delay adjustment circuit according to any one of the above (1) to (3), further comprising:
a third delay element that delays an output of the first selector included in the delay adjustment unit of the last stage among the plurality of delay adjustment units by a half cycle of the clock; and
a second selector that outputs one of the output of the first selector included in the delay adjustment unit of the last stage among the plurality of delay adjustment units and the third delay element.
(5) The delay adjustment circuit according to any one of the above (1) to (4), wherein
at least one delay adjustment unit of the plurality of delay adjustment units includes the first selector in the first delay element at the last stage among the one or more first delay elements.
(6) The delay adjustment circuit according to any one of the above (1) to (5), wherein
the output unit outputs any one of two clocks having a same cycle as the clock and phases different from each other by 90° according to an output of the first selector included in the delay adjustment unit of the last stage among the plurality of delay adjustment units.
(7) The delay adjustment circuit according to any one of the above (1) to (6), further comprising
a delay circuit that includes a variable capacitance element having a variable capacitance, and changes a delay amount with respect to an input signal by changing the capacitance of the variable capacitance element,
wherein an output of the output unit is input to the delay circuit.
(8) The delay adjustment circuit according to any one of the above (1) to (6), further comprising:
a phase drive circuit including a phase comparator that compares phases of the clock and a feedback signal, and a voltage generator that outputs a voltage according to a phase comparison result by the phase comparator;
a plurality of fourth delay elements connected in series that generates the feedback signal by delaying the clock by a delay amount according to an output of the phase drive circuit; and
a plurality of fifth delay elements connected in series, each of the fifth delay elements delaying and outputting an output of the output unit by a delay amount according to an output of the phase drive circuit.
(9) A distance measuring device comprising:
a delay adjustment circuit including
a plurality of delay adjustment units connected in series, each of the delay adjustment units including one or more first delay elements connected in series that delay an input signal based on a clock, and a first selector that outputs one of the input signal and an output of the first delay element at a last stage among the one or more first delay elements, and each of the plurality of delay adjustment units includes a different number of the first delay elements, and
an output unit that outputs the clock according to an output of the first selector included in a delay adjustment unit of a last stage among the plurality of delay adjustment units;
a light source unit that emits light in response to a light emission instruction;
a light receiving unit that receives light; and
a distance measuring unit that performs distance measurement based on a light emission timing at which light is emitted by the light source unit and a light reception timing at
which light is received by the light receiving unit,
wherein the light source unit causes light to be emitted according to the clock output from the output unit of the delay adjustment circuit using the light emission instruction as the input signal.
(10) The distance measuring device according to the above (9), wherein
the distance measuring unit performs the distance measurement by an indirect time of flight (ToF) method.

REFERENCE SIGNS LIST 10, 10a, 10b, 10c DELAY ADJUSTMENT CIRCUIT
100, 101, $101_1$, $101_2$, $101_3$, $101_4$, 102, $102_{11}$, $102_{12}$, $102_{21}$, $102_{22}$, $102_{31}$, $102_{32}$, $102_{33}$, $102_{34}$, $102_{41}$, $102_{42}$, $102_{43}$, $102_{44}$, $102_{45}$, $102_{46}$, $102_{47}$, $102_{48}$, 103, 104 FF CIRCUIT
120, $120_1$, $120_2$, $120_3$, $120_4$, 130, 130a, 130b, 150, 170 SELECTOR
140 AND CIRCUIT
180 CAPACITANCE DELAY CIRCUIT
190 DLL CIRCUIT
200, 200a DFE
300 DISTANCE MEASURING DEVICE
310 DISTANCE MEASURING UNIT
311 LIGHT SOURCE UNIT
333 DISTANCE MEASUREMENT CONTROL UNIT
334 CLOCK GENERATION UNIT
335 LIGHT EMISSION TIMING CONTROL UNIT
1020 FF CIRCUIT WITH SELECTOR

The invention claimed is:
1. A delay adjustment circuit, comprising:
a plurality of delay adjustment units connected in series, wherein each of the delay adjustment units including:
one or more first delay elements, connected in series, configured to delay an input signal based on a clock, and
a first selector configured to output one of the input signal or an output of a first delay element at a last stage among the one or more first delay elements; and an output unit configured to output the clock based on an output of the first selector included in a delay adjustment unit of a last stage among the plurality of delay adjustment units, wherein each of the plurality of delay adjustment units includes a different number of the first delay elements.

2. The delay adjustment circuit according to claim 1, wherein
each of the plurality of delay adjustment units further includes one or more second delay elements that are configured to:
delay the input signal based on the clock, and
input the delayed input signal to a first delay element at a foremost stage among the one or more first delay elements and the first selector.

3. The delay adjustment circuit according to claim 1, wherein
each of the plurality of delay adjustment units includes a power-of-two number of the first delay elements.

4. The delay adjustment circuit according to claim 1, further comprising:
a third delay element configured to delay the output of the first selector included in the delay adjustment unit of the last stage among the plurality of delay adjustment units by a half cycle of the clock; and
a second selector configured to output one of the output of the first selector included in the delay adjustment unit of the last stage among the plurality of delay adjustment units or an output of the third delay element.

5. The delay adjustment circuit according to claim 1, wherein
at least one delay adjustment unit of the plurality of delay adjustment units includes the first selector in the first delay element at the last stage among the one or more first delay elements.

6. The delay adjustment circuit according to claim 1, wherein
the output unit is further configured to output one of two clocks having a same cycle as the clock and phases different from each other by 90° based on the output of the first selector included in the delay adjustment unit of the last stage among the plurality of delay adjustment units.

7. The delay adjustment circuit according to claim 1, further comprising a delay circuit that includes a variable capacitance element having a variable capacitance, wherein
the delay circuit is configured to change a delay amount with respect to an input signal based on a change in the variable capacitance of the variable capacitance element, and
an output of the output unit is input to the delay circuit.

8. The delay adjustment circuit according to claim 1, further comprising:

a phase drive circuit including:
a phase comparator configured to compare phases of the clock and a feedback signal, and
a voltage generator configured to output a voltage based on a phase comparison result by the phase comparator;
a plurality of fourth delay elements, connected in series, configured to generate the feedback signal based on
a delay in the clock by a delay amount, and
an output of the phase drive circuit; and
a plurality of fifth delay elements connected in series, wherein each of the fifth delay elements is configured to delay and output an output of the output unit by a delay amount based on an output of the phase drive circuit.

9. A distance measuring device, comprising:
a delay adjustment circuit including:
a plurality of delay adjustment units connected in series, wherein each of the delay adjustment units including:
one or more first delay elements, connected in series, configured to delay an input signal based on a clock, and
a first selector configured to output one of the input signal or an output of a first delay element at a last stage among the one or more first delay elements, wherein each of the plurality of delay adjustment units includes a different number of the first delay elements, and
an output unit configured to output the clock based on an output of the first selector included in a delay adjustment unit of a last stage among the plurality of delay adjustment units;
a light source unit configured to emit light based on a light emission instruction;
a light receiving unit configured to receive light; and
a distance measuring unit configured to perform distance measurement based on a light emission timing at which the light is emitted by the light source unit and a light reception timing at which the light is received by the light receiving unit,
wherein the light source unit is further configured to emit light based on the clock output from the output unit of the delay adjustment circuit using the light emission instruction as the input signal.

10. The distance measuring device according to claim 9, wherein
the distance measuring unit is configured to perform the distance measurement by an indirect time of flight (ToF) method.

* * * * *